US008995493B2

(12) United States Patent
Joseph et al.

(10) Patent No.: US 8,995,493 B2
(45) Date of Patent: Mar. 31, 2015

(54) MICROLENSES FOR MULTIBEAM ARRAYS OF OPTOELECTRONIC DEVICES FOR HIGH FREQUENCY OPERATION

(71) Applicant: TriLumina Corporation, Albuquerque, NM (US)

(72) Inventors: John R. Joseph, Albuquerque, NM (US); Richard F. Carson, Albuquerque, NM (US); Mial E. Warren, Albuquerque, NM (US); Kevin L. Lear, Fort Collins, CO (US)

(73) Assignee: TriLumina Corp., Albuquerque, NM (US)

( * ) Notice: Subject to any disclaimer, the term of this patent is extended or adjusted under 35 U.S.C. 154(b) by 132 days.

(21) Appl. No.: 13/902,555

(22) Filed: May 24, 2013

(65) Prior Publication Data

US 2013/0266326 A1 Oct. 10, 2013

Related U.S. Application Data

(63) Continuation-in-part of application No. 13/077,769, filed on Mar. 31, 2011, which is a continuation of application No. 12/707,657, filed on Feb. 17, 2010, now Pat. No. 7,949,024, application No. 13/902,555, (Continued)

(51) Int. Cl.
*H01S 5/00* (2006.01)
*H01S 5/183* (2006.01)
(Continued)

(52) U.S. Cl.
CPC ............ *H01S 5/183* (2013.01); *H04B 10/1141* (2013.01); *H01S 5/423* (2013.01);
(Continued)

(58) Field of Classification Search
CPC .. H01S 5/423; H01S 5/18388; H04B 10/1141
USPC .......................................... 372/43.01; 385/24
See application file for complete search history.

(56) References Cited

U.S. PATENT DOCUMENTS 3,805,255 A 4/1974 Baker
4,127,322 A 11/1978 Jacobsen et al.
(Continued)

FOREIGN PATENT DOCUMENTS

DE 102008030844 A1 12/2009
EP 1024399 12/2005
WO WO 2005/057267 6/2005
WO WO 2011/021140 A2 2/2011

OTHER PUBLICATIONS

Warren et al., Integration of Diffractive Lenses with Addressable Vertical-Cavity Laser Arrays, Sandia National Laboratories, Albuquerque, NM 87185, Apr. 1, 1995, Conf-950226-38, Sand 95-0360C, 11 pages.*

(Continued)

*Primary Examiner* — Tuan Nguyen
(74) *Attorney, Agent, or Firm* — Baker & Hostetler LLP

(57) ABSTRACT

A VCSEL array device formed of a monolithic array of raised VCSELs on an electrical contact and raised inactive regions connected to the electrical contact. The VCSELs can be spaced symmetrically or asymmetrically, in a manner to improve power or speed, or in phase and in parallel. The raised VCSELs and raised inactive regions are positioned between the electrical contact and an electrical waveguide. The VCSELs may be separated into subarrays and each VCSEL may be covered with an integrated or bonded microlens for directing light without external lenses. The microlenses may be offset to collect or collimate light and may be shaped to form various lens profiles.

68 Claims, 27 Drawing Sheets

Related U.S. Application Data filed on May 24, 2013, which is a continuation-in-part of application No. 13/868,034, filed on Apr. 22, 2013.

(60) Provisional application No. 61/153,190, filed on Feb. 17, 2009, provisional application No. 61/636,570, filed on Apr. 20, 2012.

(51) Int. Cl.
| | |
|---|---|
| *H04B 10/114* | (2013.01) |
| *H01S 5/42* | (2006.01) |
| *H01S 5/40* | (2006.01) |
| H01S 5/022 | (2006.01) |
| H01S 5/024 | (2006.01) |
| H01S 5/062 | (2006.01) |
| H01S 5/042 | (2006.01) |

(52) U.S. Cl.
CPC ........... *H01S5/18388* (2013.01); *H01S 5/4012* (2013.01); *H01S 5/0014* (2013.01); *H01S 5/005* (2013.01); *H01S 5/0224* (2013.01); *H01S 5/02272* (2013.01); *H01S 5/02276* (2013.01); *H01S 5/02469* (2013.01); *H01S 5/06226* (2013.01); *H01S 5/18311* (2013.01); *H01S 5/18347* (2013.01); *H01S 2301/176* (2013.01); *H01S 5/0425* (2013.01)
USPC ...................................................... 372/50.12

(56) References Cited

U.S. PATENT DOCUMENTS

| | | | |
|---|---|---|---|
| 4,447,136 A | 5/1984 | Kitamura | |
| 4,448,491 A | 5/1984 | Okubo | |
| 4,822,755 A | 4/1989 | Hawkins et al. | |
| 4,827,482 A | 5/1989 | Towe et al. | |
| 4,850,685 A | 7/1989 | Kamakura et al. | |
| 4,870,652 A | 9/1989 | Thornton | |
| 4,881,237 A | 11/1989 | Donnelly | |
| 4,971,927 A | 11/1990 | Leas | |
| 5,034,344 A | 7/1991 | Jewell et al. | |
| 5,070,399 A | 12/1991 | Martel | |
| 5,073,041 A | 12/1991 | Rastani | |
| 5,098,183 A | 3/1992 | Sonehara | |
| 5,164,949 A | 11/1992 | Ackley et al. | |
| 5,258,316 A | 11/1993 | Ackley et al. | |
| 5,325,386 A | 6/1994 | Jewell et al. | |
| 5,328,854 A | 7/1994 | Vakhshoori et al. | |
| 5,359,618 A | 10/1994 | Lebby et al. | |
| 5,420,879 A | 5/1995 | Kawarada et al. | |
| 5,422,753 A | 6/1995 | Harris | |
| 5,422,903 A | 6/1995 | Yamada et al. | |
| 5,457,561 A | 10/1995 | Taneya et al. | |
| 5,504,767 A | 4/1996 | Jamison et al. | |
| 5,557,115 A | 9/1996 | Shakuda et al. | |
| 5,574,738 A | 11/1996 | Morgan | |
| 5,581,571 A | 12/1996 | Holonyak et al. | |
| 5,640,188 A | 6/1997 | Andrews | |
| 5,707,139 A | 1/1998 | Haitz | |
| 5,758,951 A | 6/1998 | Haitz | |
| 5,801,666 A | 9/1998 | Macfarlane | |
| 5,812,571 A | 9/1998 | Peters et al. | |
| 5,825,803 A | 10/1998 | Labranche et al. | |
| 5,896,408 A | 4/1999 | Corzine et al. | |
| 5,918,108 A | 6/1999 | Peters | |
| 5,930,279 A | 7/1999 | Apollonov et al. | |
| 5,976,905 A | 11/1999 | Cockerill et al. | |
| 5,991,318 A | 11/1999 | Caprara et al. | |
| 6,044,101 A | 3/2000 | Luft | |
| 6,075,804 A | 6/2000 | Deppe et al. | |
| 6,125,598 A | 10/2000 | Lanphier | |
| 6,128,131 A | 10/2000 | Tang | |
| 6,136,623 A | 10/2000 | Hofstetter et al. | |
| 6,154,480 A | 11/2000 | Magnusson et al. | |
| 6,167,068 A | 12/2000 | Caprara et al. | |
| 6,215,598 B1 | 4/2001 | Hwu | |
| 6,259,715 B1 | 7/2001 | Nakayama | |
| 6,393,038 B1 | 5/2002 | Raymond et al. | |
| 6,446,708 B1 | 9/2002 | Lai | |
| 6,493,368 B1 | 12/2002 | Chirovsky et al. | |
| 6,608,849 B2 | 8/2003 | Mawst et al. | |
| 6,728,289 B1 | 4/2004 | Peake et al. | |
| 6,757,314 B2 | 6/2004 | Kneissl et al. | |
| 6,775,308 B2 | 8/2004 | Hamster et al. | |
| 6,898,222 B2 | 5/2005 | Hennig et al. | |
| 6,943,875 B2 | 9/2005 | DeFelic et al. | |
| 6,947,459 B2 | 9/2005 | Kurtz et al. | |
| 6,959,025 B2 | 10/2005 | Jikutani et al. | |
| 7,016,381 B2 | 3/2006 | Husain et al. | |
| 7,126,974 B1 | 10/2006 | Dong et al. | |
| 7,257,141 B2 | 8/2007 | Chua | |
| 7,262,758 B2 | 8/2007 | Kahen et al. | |
| 7,315,560 B2 | 1/2008 | Lewis et al. | |
| 7,357,513 B2 | 4/2008 | Watson et al. | |
| 7,359,420 B2 | 4/2008 | Shchegrov et al. | |
| 7,385,229 B2 | 6/2008 | Venugopalan | |
| 7,388,893 B2 | 6/2008 | Watanabe et al. | |
| 7,430,231 B2 | 9/2008 | Luo et al. | |
| 7,471,854 B2 | 12/2008 | Cho et al. | |
| 7,613,215 B2 | 11/2009 | Kim | |
| 7,680,168 B2 | 3/2010 | Uchida | |
| 7,688,525 B2 | 3/2010 | Hines et al. | |
| 7,751,716 B2 | 7/2010 | Killinger | |
| 7,970,279 B2 | 6/2011 | Dress | |
| 2001/0040714 A1 | 11/2001 | Sundaram et al. | |
| 2001/0043381 A1 | 11/2001 | Green et al. | |
| 2002/0034014 A1 | 3/2002 | Gretton et al. | |
| 2002/0041562 A1 | 4/2002 | Redmond et al. | |
| 2002/0141902 A1 | 10/2002 | Ozasa et al. | |
| 2003/0091084 A1 | 5/2003 | Sun et al. | |
| 2003/0215194 A1 | 11/2003 | Kuhmann et al. | |
| 2004/0120717 A1 | 6/2004 | Clark et al. | |
| 2004/0207926 A1 | 10/2004 | Buckman et al. | |
| 2004/0208596 A1 | 10/2004 | Bringans et al. | |
| 2005/0019973 A1 | 1/2005 | Chua | |
| 2005/0025211 A1 | 2/2005 | Zhang et al. | |
| 2005/0147135 A1 | 7/2005 | Kurtz et al. | |
| 2006/0109883 A1 | 5/2006 | Lewis et al. | |
| 2006/0268241 A1 | 11/2006 | Watson et al. | |
| 2006/0280219 A1 | 12/2006 | Shchegrov et al. | |
| 2007/0052660 A1 | 3/2007 | Montbach et al. | |
| 2007/0099395 A1 | 5/2007 | Sridhar et al. | |
| 2007/0153862 A1 | 7/2007 | Shchegrov et al. | |
| 2007/0153866 A1 | 7/2007 | Shchegrov et al. | |
| 2007/0273957 A1 | 11/2007 | Zalevsky et al. | |
| 2008/0205462 A1 | 8/2008 | Uchida | |
| 2008/0273830 A1 | 11/2008 | Chen et al. | |
| 2009/0141242 A1 | 6/2009 | Silverstein et al. | |
| 2009/0245312 A1 | 10/2009 | Kageyama et al. | |
| 2009/0284713 A1 | 11/2009 | Silverstein et al. | |
| 2010/0129946 A1 | 5/2010 | Uchida | |
| 2010/0265975 A1 | 10/2010 | Baier et al. | |
| 2011/0002355 A1 | 1/2011 | Jansen | |
| 2011/0148328 A1 | 6/2011 | Joseph et al. | |
| 2011/0164880 A1 | 7/2011 | Davidson et al. | |
| 2011/0176567 A1 | 7/2011 | Joseph | |
| 2012/0120976 A1* | 5/2012 | Budd et al. | 372/34 |
| 2012/0232536 A1 | 9/2012 | Liu et al. | |
| 2013/0076960 A1 | 3/2013 | Bublitz et al. | |

OTHER PUBLICATIONS

Gadallah, "Investigations into Matrix-Addressable VCSEL Arrays", Annual Report 2008, Institute of Optoelectronics, Ulm University, 6 pages.

Warren et al., "Integration of Diffractive Lenses with Addressable Vertical-Cavity Laser Arrays", Sandia National Laboratories, Albuquerque, NM 87185, Apr. 1, 1995, Conf-950226-38, Sand95-0360C, 11 pages.

* cited by examiner

MICROLENSES FOR MULTIBEAM ARRAYS OF OPTOELECTRONIC DEVICES FOR HIGH FREQUENCY OPERATION

CROSS REFERENCE TO RELATED APPLICATIONS

This is a continuation-in-part application taking priority from U.S. patent application Ser. No. 13/077,769, filed Mar. 31, 2011, entitled "Multibeam Arrays of Optoelectronic Devices for High Frequency Operation," which is a continuation application taking priority from U.S. patent application Ser. No. 12/707,657, filed Feb. 17, 2010, now U.S. Pat. No. 7,949,024, entitled "Multibeam Arrays of Optoelectronic Devices for High Frequency Operation," which takes priority from Provisional U.S. Patent Application No. 61/153,190, filed Feb. 17, 2009, entitled "Multibeam Arrays of Optoelectronic Devices for High Frequency Operation," the contents of which are incorporated herein by reference in its entirety.

This is a continuation-in-part application taking priority from application Ser. No. 13/868,034, filed Apr. 22, 2013, entitled "Addressable Illuminator with Eye-Safety Circuitry," which claims benefit under 35 U.S.C. §119(e) of Provisional U.S. Patent Application No. 61/636,570, filed Apr. 20, 2012, entitled "Addressable Illuminator with Eye-Safety Circuitry," the contents of which are incorporated herein by reference in its entirety.

TECHNICAL FIELD

Semiconductor devices and, more particularly, to microlens structures for multibeam arrays of photonic devices for high power and high frequency applications, and methods of making and using the same.

BACKGROUND

Semiconductor lasers have gained influence in high power laser applications because of their higher efficiency, advantages in Size, Weight And Power (SWAP) and their lower cost over other forms of high power lasers. Many laser applications such as industrial cutting and welding, Laser Detection and Ranging (LADAR), medical engineering, aviation defense, optically pumping rare earth doped fiber lasers, optically pumping solid state crystals in Diode Pumped Solid State lasers (DPSS), fiber-optic communication, and fusion research, among others, require a high power and high frequency response. Due to their high power array outputs, edge-emitting semiconductor lasers are widely used in such applications. However, degradation of these edge-emitting lasers is common, primarily as a result of Catastrophic Optical Damage (COD) that occurs due to high optical power density at the exposed emission facet.

Vertical-Cavity Surface-Emitting Lasers (VCSELs), in comparison, are not subject to COD because the gain region is embedded in the epitaxial structure and is therefore not exposed to the outside environment. Also, the optical waveguide associated with the edge-emitter junction has a relatively small area, resulting in significantly higher power densities compared to VCSELs. The practical result is that VCSELs can have lower failure rates than typical edge-emitting lasers.

To date, VCSELs have been more commonly used in data and telecommunications applications, which require higher frequency modulation, but not as much power. VCSELs have offered advantages over edge-emitting LASERs in this type of application, including ease of manufacture, higher reliability, and better high frequency modulation characteristics. Arrays of VCSELs can also be manufactured much more cost efficiently than edge-emitting laser arrays. However, with existing VCSEL designs, as the area of the array grows the frequency response has been penalized by heating complexities arising from the multi-element designs, parasitic impedances, and the frequency response of the wire bonds or leads required by the high current. Thus, the modulation frequency of the array decreases.

VCSELs and methods for manufacturing them are known. See, for example, U.S. Pat. Nos. 5,359,618 and 5,164,949, which are incorporated herein by reference. Forming VCSELs into two-dimensional arrays for data displays is also known. See U.S. Pat. Nos. 5,325,386 and 5,073,041, which are incorporated herein by reference. Flip-chip multibeam VCSEL arrays for higher output power have been mentioned, in particular, in U.S. Pat. No. 5,812,571, which are incorporated herein by reference.

However, VCSEL arrays that provide both high frequency modulation and high power have not been adequately developed. Furthermore, arraying such devices together increases heat generation, adding to the negative effects on high frequency operation.

In addition, free space optical links that are intended for short range mobile device communication are generally designed with optical elements for efficient transmission of a low divergence beam (using a collimating optic) and for efficient reception of the incident light (using a collecting lens). Since high speed detectors are very small, around 60 µm in diameter for 5-10 Gb/s speeds, the collecting optic has to focus the light down to a small spot to get a good signal-to-noise ratio. Such systems are therefore very alignment sensitive, as the small spot can easily miss the small detector if something moves or perturbs the alignment. This has made free space optical communication between mobile devices difficult. The exception has been the IrDA (Infrared Data Association) standard which uses LED-based transmission into a very broad transmission beam and a hemispherical collection optic. While free space optical links were popular for a while at relatively low speeds, as mobile device concepts have evolved, a need has arisen for high bandwidth communication between two devices that can actually be touching each other or separated by just a few millimeters. There are radio frequency approaches that will work in these near field ranges, but they have disadvantages, including omnidirectional transmission which is a security concern and regulatory issues due to RF interference concerns.

SUMMARY

An embodiment is directed to a multibeam optoelectronic device, referred to as a VCSEL array device, which has high power and a high frequency response and various microlens structures that may be formed thereon, as well as various methods for utilization of the same. The VCSEL array device is a monolithic array of VCSELs comprised of two or more VCSELs and an array of short-circuited mesa devices. The VCSELs of the VCSEL array can be spaced symmetrically or asymmetrically, spaced according to a mathematical function for improving a power or speed characteristic, or positioned for phase relationships next to each other in an electrically parallel circuit. The VCSELs of the VCSEL array are electrically connected to a first metal contact pad formed on a heat-spreading substrate or carrier. The array of short-circuited mesa devices is formed alongside the VCSEL array and the devices are bonded to a second metal contact pad on the heat spreading substrate or carrier. These mesa devices form a short circuit from the substrate ground to the second metal contact. Each VCSEL of the VCSEL array is encompassed by a metal heat sink structure, which increases the height of each VCSEL mesa, the heat sink structure and the solder. The relationship between the heat sink structure, the VCSEL array and the mesa device array reduces the parasitic impedance characteristics of the VCSEL array device, thereby increasing its output power and increasing its high frequency response. The VCSEL array and short-circuit mesa device array can also be positioned to form a coplanar waveguide lead in a ground-signal-ground configuration in the bonded optoelectronic device. This configuration provides superior signal modulation characteristics. Microlenses may be formed on the individual VCSEL devices of the array using a variety of techniques. The microlenses may be structured and/or patterned to achieve a number of effects with the output laser light not otherwise achievable with exterior lenses.

BRIEF DESCRIPTION OF THE DRAWINGS

The drawings are provided to illustrate example embodiments described herein and are not intended to limit the scope of the disclosure.

DETAILED DESCRIPTION OF ILLUSTRATIVE EMBODIMENTS

Figure 1:
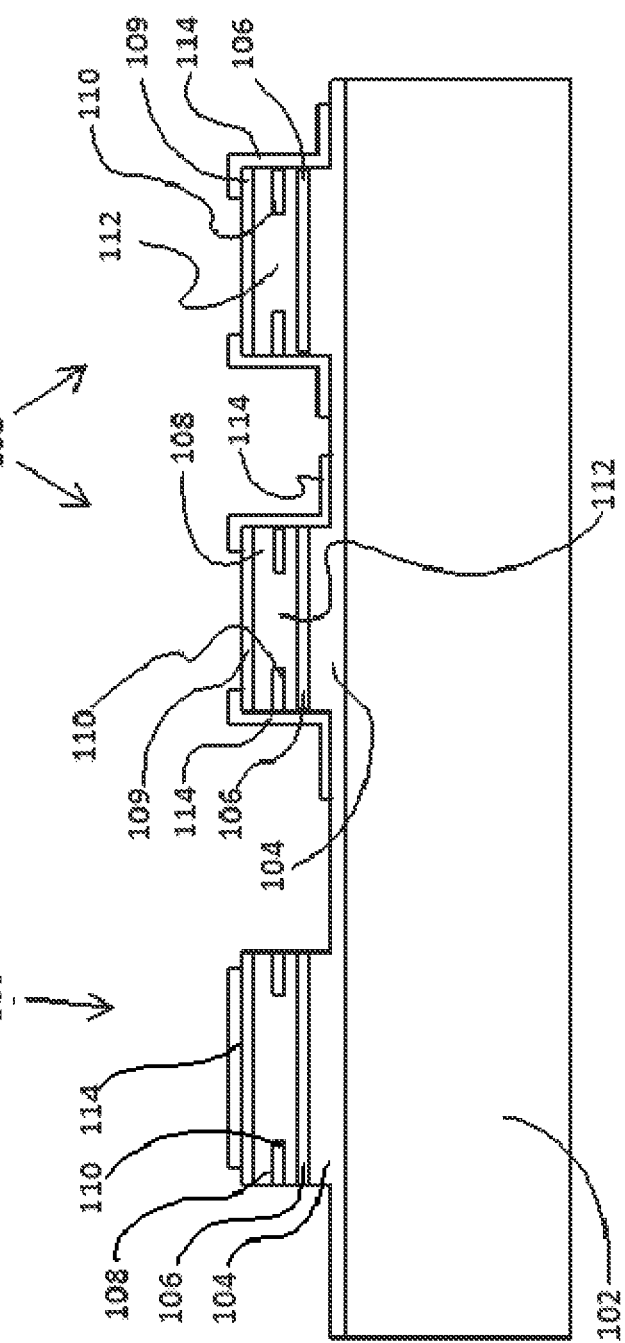
FIG. 1 is a simplified cross-sectional view illustrating the mesa structures of both the VCSEL devices and the shorting mesa devices, including dielectric deposition, metal deposition, and oxidation structures, among others features in accordance with an embodiment.

VCSEL array devices, such as those described in U.S. Pat. No. 5,812,571, are flip chip VCSEL array devices that employ a metal contact layer that is also used as a reflector for the top mirrors, and which is formed over each of the mesas. This single metal layer is customarily deposited with techniques such as electron beam (e-beam) evaporation or sputtering in order to create a highly uniform or reflective surface. Although these deposition techniques are normal for the stated application, they are not appropriate when seeking to achieve a thick metal layer encompassing the mesa, which is crucial for improved heat reduction in such devices. In order to use existing techniques to deposit a sufficiently thick layer, a large amount of metal must be used, such as Gold (Au), which significantly raises the cost of such devices. This type of design, and the design of other existing VCSEL array devices, also raises the overall impedance of the system and complicates heat management, thereby limiting the power and speed obtainable by such arrays.

In an embodiment described herein, the dissipation of heat, and the reduction of both parasitic capacitance and inductance (collectively referred to herein as a "reduction in parasitic impedance") from an optical semiconductor device array are achieved by reducing the common p-contact area to a minimal size and increasing the distance between the common contact pad and the substrate ground, while surrounding the common contact pad with a ground plane at a distance derived from the properties of a coplanar waveguide, and forming a raised heat sink proximate to each active mesa element and grounding mesa in the array. The minimized common p-contact area of the embodiment departs significantly from existing designs which require an extended common p-contact area in order to make contact with wire bonds. The embodiment eliminates the need for wire bonds. The elimination of wire leads reduces inductance, while the raised height of the resulting mesas and heat sink structure increases the distance between the negative and positive potentials under electrical bias from the substrate ground to the contact pad on the heat sink substrate, thereby reducing the overall parasitic capacitance of the system. This is achieved through the use of a seed layer for formation of a thick plated metal heat sink that allows for much greater heat reduction through the edge of each VCSEL, as well as improving frequency response.

Additionally, the ground (or negative) electrical connection is contacted through shorted mesa devices bringing the current flow through a coplanar lead and to the heat spreader, or heat reducing substrate, without the use of wire bonds. Wire bonds are used in existing designs to connect the top of the substrate to the ground of the package and are undesirable because they introduce parasitic inductance, which has negative effects on the frequency response of VCSEL array devices. Furthermore, the numerous wire bonds required by existing designs introduce significant manufacturing complexity, greater potential for defects, and increased costs.

FIG. 1 shows a simplified schematic cross-section of VCSEL array device 100 in accordance with an embodiment. It will be understood that the illustration of the VCSEL array device in the embodiment shows a semiconductor device array and a method of fabricating and bonding the semiconductor device array. It will be understood, however, that the method disclosed therein can be used to fabricate arrays of other semiconductor devices, such as light emitting diodes, photodetectors, edge-emitting lasers, modulators, high electron mobility transistors, resonant tunneling diodes, heterojunction bipolar transistors, quantum dot lasers and the like. Further, it will be understood that the illustration of VCSEL array device 100 in the embodiment is for illustrative purposes only and is in no way meant to limit the scope of the invention.

In the embodiment, VCSEL array device 100 includes a substrate 102 which includes Gallium Arsenide (GaAs), although other materials such as Indium Phosphide (InP), Indium Arsenide (InAs), Silicon (Si), an epitaxially grown material, and the like, could be used to form the substrate 102. It will also be understood that substrate 102 typically includes a lattice constant chosen to minimize defects in a material layer subsequently grown thereon. It will also be understood that the choice of at least one of the compositions and the thicknesses of the subsequently grown material layers will provide a desired wavelength of operation. Subsequent layers are deposited on the substrate 102 via epitaxial growth using Molecular Beam Epitaxy (MBE), Metal-Organo-Chemical Vapor Deposition (MOCVD), and the like.

In the embodiment, a lattice-matched lower Distributed Bragg Reflector (DBR) 104 is epitaxily deposited on substrate 102 to form the first of the raised layers of the VCSEL mesas 103 and the short-circuiting/shorting/grounding mesa 105. The lower DBR 104 is formed from multiple layers of alternating materials with varying (a high and a low) indexes of refraction, or by periodic variation of some characteristic, such as height, of a dielectric waveguide, resulting in periodic variation in the effective refractive index in the guide. Each layer boundary causes a partial reflection of an optical wave, with the resulting combination of layers acting as a high-quality reflector at a desired wavelength of operation. Thus, while the lower DBR 104 (and upper DBR 108, as further described below) includes more than one material layer, it is illustrated in FIG. 1 as being comprised of a single layer for simplicity and ease of discussion herein. A portion of lower DBR 104 can also be made conductive to allow an electrical contact (not shown) to be made to the VCSEL array device.

In the embodiment, an active region 106 is epitaxily deposited on lower DBR 104. Although shown as a single layer (again for simplicity and ease of discussion), active region 106 comprises cladding (and/or waveguiding) layers, barrier layers, and an active material capable of emitting a substantial amount of light at a desired wavelength of operation. In the embodiment, the wavelength of operation is a wavelength within a range approximately given from about 620 nm to about 1600 nm (for a GaAs substrate). However, it will be understood that other wavelength ranges may be desired and will depend on the application.

As is understood by those skilled in the art, the wavelength of emission is substantially determined according to the choice of materials used to create lower DBR 104 and upper DBR 108, as well as the composition of the active region 106. Further, it will be understood that active region 106 can include various light emitting structures, such as quantum dots, quantum wells, or the like. In the embodiment, upper DBR 108 is positioned on active region 106, and like lower DBR 104, is electrically conductive to allow ohmic electrical connections to be formed (not shown). In some embodiments, lower DBR 104 is n-doped and upper DBR 108 is p-doped, but this can be reversed, where lower DBR 104 is p-doped and upper DBR 108 is n-doped. In other embodiments, electrically insulating DBRs can be employed (not shown), which utilize intra-cavity contacts and layers closer to the active region.

In some embodiments, an upper mirror contacting layer 109 is positioned on upper DBR 108. Contacting layer 109 is typically heavily doped so as to facilitate ohmic electrical connection to a metal deposited on contacting layer 109, and hence to an electrical circuit (not shown). In some embodiments, contacting layer 109 can be formed as part of upper DBR 108.

Lithography and etching can be used to define each of the mesas 103 and 105 and their structures stated above. This can be achieved by patterning the epitaxially-grown layers through a common photolithography step, such as coating, exposing, and developing a positive thick resist. The thickness of the resist can be varied as is known in the art, depending on etch-selectivity between the resist and the epitaxial layers, and the desired mesa geometry.

For GaAs-based materials, etching is usually accomplished using a Chlorine (Cl) based dry etch plasma, such as $Cl_2:BCl_3$, but any number of gases or mixtures thereof could be used. Etching can also be accomplished by many wet etchants. Other forms of etching, such as ion milling or reactive ion beam etching and the like, can also be used. The depth of the etch is chosen to be deep enough to isolate the active regions of mesas in the array. The etch stops either on the N mirror (lower DBR 104), an etch stop/contact layer formed in the N mirror (lower DBR 104), or through the N mirror (lower DBR 104) into the substrate 102. After etching to form the mesas, the remaining photoresist is removed. This can be achieved using a wet solvent clean or dry Oxygen ($O_2$) etching or a combination of both.

A confinement region 110 can also be formed within each of the mesas. Within the VCSEL mesas 103, the confinement region 110 defines an aperture 112 for the device. The confinement region 110 can be formed as an index guide region, a current guide region, and the like, and provides optical and/or carrier confinement to aperture 112. Confinement regions 110 can be formed by oxidation, ion implantation and etching. For example, an oxidation of a high Aluminum (Al) content layer (or layers) can be achieved by timing the placement of the wafer or sample in an environment of heated Nitrogen ($N_2$) bubbled through Water (H₂O) and injected into a furnace generally over 400° C. A photolithographic step to define an ion implant area for current confinement, and combinations of these techniques and others known in the art, can also be used.

It will be understood that confinement region 110, defining aperture 112, can include more than one material layer, but is illustrated in the embodiment as including one layer for simplicity and ease of discussion. It will also be understood that more than one confinement region can be used.

In the embodiments shown in the Figures, the mesa size, and apertures of the light producing VCSELs are the same and have uniform spacing. However, in some embodiments, the individual VCSEL mesa size for the devices in an array can differ. Furthermore, the VCSEL mesa spacing in the array can differ. In some embodiments, the separation of the light producing VCSELs mesas in an array 100 is between approximately 20 μm and 200 μm. However, larger and smaller separations are also possible.

Dielectric deposition can be used and processed to define an opening for a contact surface. First, the deposition of a dielectric material 114 over the entire surface of the device 100 is usually accomplished by Plasma Enhanced Chemical Vapor Deposition (PECVD), but other techniques, such as Atomic Layer Deposition (ALD), can be used. In the embodiment, the dielectric coating 114 is a conformal coating over the upper surface (including the mesa sidewalls) and is sufficiently thick so as to prevent current leakage through pinholes from subsequent metal layers.

Other properties to consider while choosing the thickness of this film is the capacitance created between the plated metal heat sink 124 (further described below with reference to FIG. 2) and the substrate 102 ground, where the dielectric layer 114 would be more beneficial to be thicker, and the need for the dielectric layer 114 on the sidewalls of the VCSEL 103 to transfer heat from the active region to the heat sink 124, where a thinner layer would be beneficial. In some embodiments, multiple depositions using different deposition techniques can be used to accomplish a layer with both of these properties. An example of this technique is to follow a deposition of PECVD Silicon Nitride ($Si_3N_4$) with an E-beam deposition of $Si_3N_4$, or another dielectric could be deposited that has a more directional deposition rate, thereby putting thicker dielectric material on the incident surfaces. Once the dielectric layer 114 has been formed, a photolithographic process is then used to define openings in the dielectric over each of the VCSELs mesas where contact is to be made to the top mirror contact layer 109. The dielectric layer 114 is also removed over the substrate 102 between each of the VCSEL mesas 103, over the substrate 102 surrounding the ground mesa 105, and over the top and side of each ground mesa 105.

Figure 2:
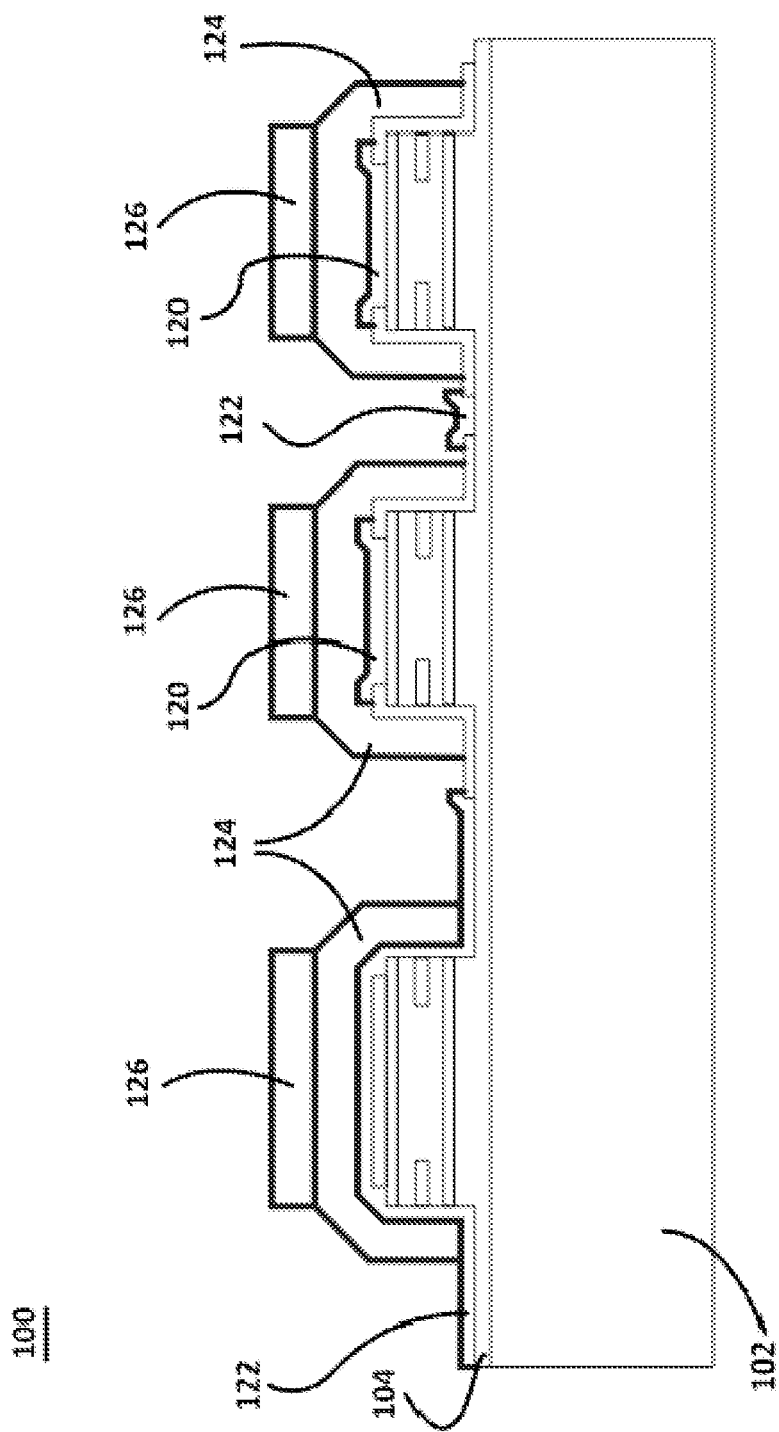
FIG. 2 is another simplified cross-sectional view of the VCSEL devices and the shorting mesa devices, further illustrating heat sinks, bonding layers, and other features in accordance with an embodiment.

Turning now to FIG. 2, the next processing step is a photolithographic process that is used to define the contacts over the top mirrors 108, where the dielectric was opened in the above step, so that a p-metal layer can be formed therein in a subsequent step. In the embodiment, the opened area in the photoresist is slightly larger than the opening in the dielectric, typically of the order of a few μm wider. In other embodiments, its diameter can be smaller than the diameter of the dielectric opening, or as large as the diameter of the heat sink material over the shorted mesas, which is plated at a later step. This opening could not be any larger than the mesa diameter in an active light producing mesa or the subsequent metals would short out the p- and n-potentials, unless the dielectric coating is conformal and covering the N mirror portion at the mesa base.

Once the opened areas in the photoresist are defined, metalization can be performed, typically with a p-type metal, over the opened areas. The p-metal contact layer 120 is usually a multilayer deposition that is deposited by E-beam, resistive evaporation, sputter, or any other metal deposition techniques. A thin Titanium (Ti) layer is first deposited for adhesion of the next layer. The thickness of this adhesion layer can vary greatly, but is generally chosen to be between about 50 Å and about 400 Å as the Ti films are stressful and more resistive than the subsequent layers. In an embodiment, the adhesion layer is approximately 200 Å thick. Other adhesive metal layers can be substituted for this layer such as Chromium (Cr), Palladium (Pd), Nickel (Ni), and the like. Also this layer can serve as a reflector layer to increase reflectance of the contacting mirror.

The next layer is deposited directly on top of the adhesion layer without breaking vacuum during the deposition. In many cases this layer acts as a guard against the Gold (Au) or other top metals from diffusing too far into the contact (a diffusion barrier) because of excessive heating at the bonding stage. Metals chosen are generally Pd, Platinum (Pt), Ni, Tungsten (W), or other metals or combinations of these metals chosen for this purpose. The thickness chosen should depend upon specific bonding temperatures needed in the flip chip process. The thickness of this layer is typically between about 1,000 Å and about 10,000 Å. In embodiments where a low temperature bonding process is used, for example, in an Indium bonding process, a diffusion barrier layer can be optional, and not deposited as part of the metal contact stack.

The next layer is generally Au but can be Pd or Pt or mixtures such as Gold Beryllium (AuBe) or Gold Zinc (AuZn). In the embodiment described below, the thickness of this layer is approximately 2,000 Å. However, it can generally have a wide range of thicknesses depending on the photo resist properties and heating characteristics of the deposition. In some embodiments, another metal can also be deposited at this time to increase metal thickness and to form the metal heat sink at this stage, thereby reducing the number of processing steps, but this technique is not necessary and was not utilized in the demonstration devices described below.

Generally a common liftoff technique is chosen for this photolithographic process so that the metal deposited on the surface can easily be separated from the areas of the surface covered with photoresist, such that any metal on the photoresist is removed without sticking to or affecting the adhesion of the metal to the semiconductor. As noted above, a photolithographic process is then used to define the openings over various portions of the substrate 102 and the shorted n-contact mesas 105, where the dielectric was opened in a previous step. In an embodiment, the opened area in the photoresist corresponding to the n-metal deposition should be slightly larger than the opening in the dielectric openings for the n-metal. N-metal layer 122 is then deposited and can form an electrical circuit with the substrate 102 either through the lower DBR 104 (if an n-mirror), an etch stop and contact layer which is generally heavily doped within lower DBR 104, or to substrate 102 itself. The process to form the n-metal layer 122 is similar to that for the p-metal layer 120. The metal layers can be chosen to include the combinations of Ni/Ge/Au, Ge/Au/Ni/Au, or many such combinations. In some embodiments, the first layer or layers are chosen to reduce contact resistance by diffusion into the n-doped epitaxial material of the substrate 102. In other embodiments, the first layer of the multi-layer metal stack can also be chosen as a diffusion-limiting layer such as Ni so that in the annealing process the metals do not "clump" and separate due to the various diffusion properties of the materials. Evenly distributing diffusion of these metals is desired and can be used to lower the contact resistance which also reduces heating. The thickness of this multi-layer metal stack can vary greatly. In the embodiment to be described, a Ni/Ge/Au metal stack with thicknesses of 400 Å/280 Å/2,000 Å, respectively, was used.

A Rapid Thermal Anneal (RTA) step is then performed on the wafer in order to lower contact resistance. For the embodiment described, the process temperature is rapidly ramped up to ~400° C., held for about 30 seconds and ramped down to room temperature. The temperature and time conditions for the RTA step depend on the metalization, and can be determined using a Design Of Experiment (DOE), as known to those of ordinary skill in the art.

In other embodiments, this step can be performed at an earlier or later stage of the process flow, but is generally done before solder is deposited so as to reduce oxidation of the solder or adhesive metal. A photolithographic process (using a thin layer of photoresist, typically around 1 µm to 3 µm, is used and developed to define the contact openings over the substrate 102 and shorted N contact mesas 105, and active mesas 103 where the heat sink structures will be plated or built up. The next step is deposition of the metal seed layer and is usually a multilayer deposition and deposited by E-beam, resistive evaporation, sputter or any other metal deposition techniques. The metal layers can be chosen such as Ti/Au, 20 Å/600 Å, or many such combinations where the first layer or layers is deposited for adhesion and ease to etch off, and the second layer for conductivity and ease to etch off. The seed layer is continuous over the surface allowing electrical connections for plating, if this technique is used for building up the heat sinks.

In an embodiment, a thick metal is then deposited by plating, to form heat sink 124. However, other methods of deposition can also be used, in which case the metal seed layer is not required. For plating, a photolithographic process is used to define the openings over the openings defined with the previous seed layer resist. The photoresist is removed in the areas where the deposition will occur. The thickness of the photoresist must be chosen so that it will lift off easily after the thick metal is defined and typically ranges in thickness from about 4 µm to about 12 µm. A plasma clean using $O_2$, or water in combination with Ammonium Hydroxide, ($NH_4OH$), is performed to clear any of the resist left on the gold seed layer. The heat sink 124 metal is plated next by means of a standard plating procedure. In the embodiment described, Copper (Cu) was chosen as the metal for plating due to its thermal conductance properties, but non-oxidizing metals, such as Au, Pd, Pt, or the like, that provide good thermal conductance and provide an interface that does not degrade device reliability, could be more appropriate. Plating thicknesses can vary. In the embodiment described, an approximately 3 µm thickness was used.

Next the wafer or sample is placed in a solder plating solution such as Indium (In) plating to form a bonding layer 126. Other metals can be chosen at this step for their bonding characteristics. The thickness can vary greatly. In the embodiment described, approximately 2 µm of plated In was deposited on the heat sinks. However, other solders such as Gold Tin (AuSn) alloys can also be used, and alternative deposition techniques such as sputtering can also be used. After metal deposition is complete, the photoresist is then removed using solvents, plasma cleaned, or a combination of both, as previously described, and the seed layer is etched with a dry or wet etch that etches Au, then etched in a dry or wet etch that etches Ti and/or removes $TiO_2$. The seed layer photoresist is then cleaned off with standard resist cleaning methods. At this point, the VCSEL array substrate is complete and ready for bonding.

The full encasement of the mesas with a thick heat sink material is an important aspect of the embodiment. Since the active regions of the mesas are closest to the edge where the thick heat sink material is formed, there is good thermal conductance, thereby enabling the design of the embodiment to efficiently and effectively remove heat generated by those active regions. As previously noted, this is a significant departure from existing VCSEL array device heat reduction techniques, which place the heat sink material on top of the mesa. These existing or prior designs require heat to move through a series of higher thermally conductive materials (mirrors) or dielectrics, thereby resulting in less efficient and effective heat reduction.

Although some existing designs encompass the mesa with a thin layer of heat sink material, for the purpose of reducing heat, these designs do not take into the consideration the height of the resulting heat sink. By using a thick heat sink layer and adding to the distance between the n-substrate ground potential and the p-contact plane on the heat sink substrate, present embodiments decrease parasitic capacitance of the system as the height of the heat sink layer is increased. Further, in addition to reducing heat, the build-up of additional material increases frequency response. In another embodiment, the dielectric layer 114 covers the entire n-mirror or substrate around the mesas and is not opened so that the heat sink material can completely encompass all mesas and form one large heat sink structure, instead of individual mesas of heat sinks. In this case, the n-contacts would only be needed to extend from the short circuited mesas to the substrate. The heat sinks of the embodiment also improve the operation of the VCSEL array by reducing the amount of heat generated by neighboring mesas. A reduction in thermal resistance within most electrical devices will increase the frequency response of each device. By improving the thermal performance of the VCSEL array device of the present device, a significant increase in the high speed performance of the VCSEL array device is made possible. Furthermore, in this embodiment it is also evident that the extra height given the mesas, because of the thickened heat sinking build up compared to the existing array circuits, reduces capacitance by increasing the distance between the substrate ground plane and the positive contact plate connecting all active mesas in parallel. The resultant effect is a reduction in parasitic impedance of the circuit which also increases the frequency response of the entire array.

Also, the short circuited mesa design, which forms a subarray surrounding the active regions, allows current flow directly from the fabricated VCSEL substrate to the ground plane on the heat spreader without the use of forming multiple wire bonds. This aspect of the embodiment reduces the complexity of fabrication, and also reduces parasitic inductance from the multiple wire bonds exhibited in the existing arrays. The short circuited mesa design, when flipped chipped to the heat spreader substrate, forms a coplanar waveguide which is beneficial to the frequency response of the array. This design feature also enables simpler packaging designs that do not require raised wire bonds, which also impact reliability and positioning.

Figure 3A:
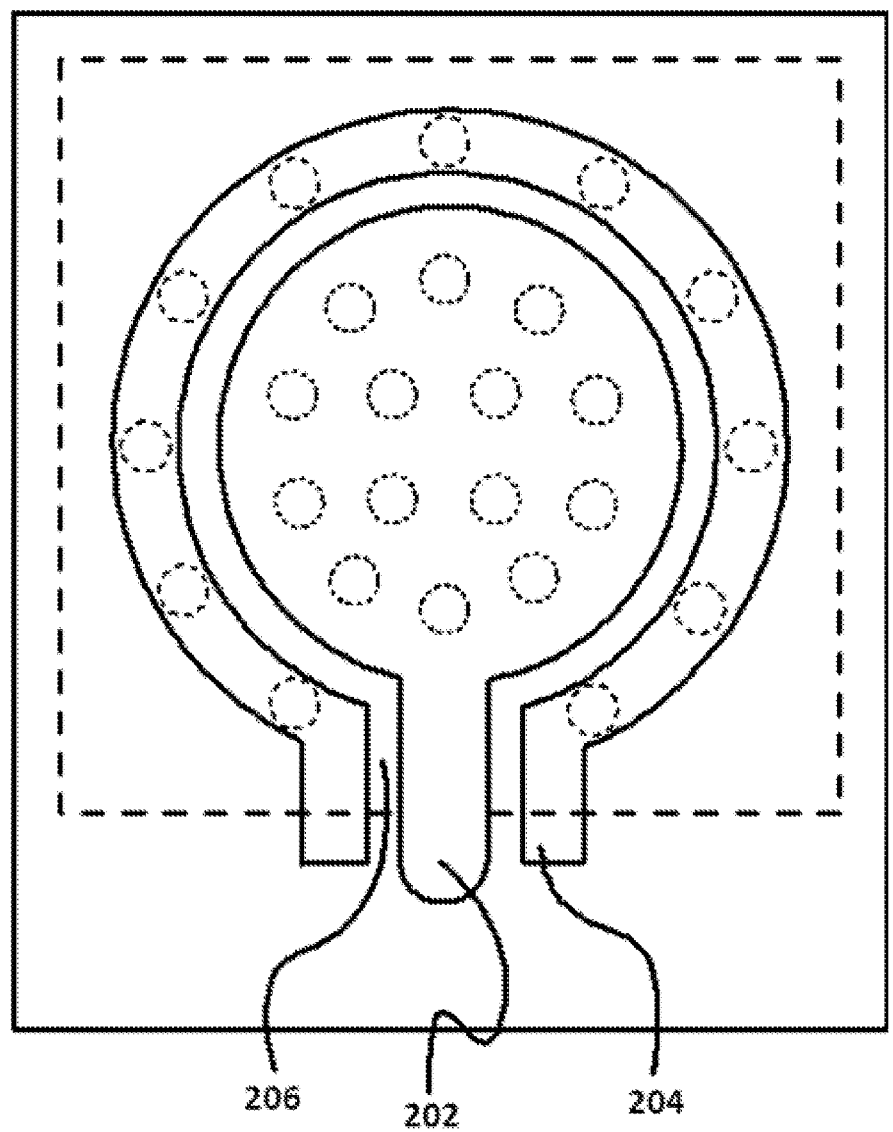
FIG. 3A is a top plan view of a patterned heat spreading substrate illustrating the coplanar waveguide formed from the encircling grounding plane, the signal lead to ground plane gap separation, and the signal lead in accordance with an embodiment.

Referring now to FIG. 3A, the process for preparing the heat spreading or heat-reducing substrate 200 which is electrically non-conductive, to be attached to the array 100 is described. First, a photoresist is deposited and defined over the surface of a substrate. Generally a common liftoff technique is then chosen for the next photolithographic process so that a metal is deposited on the surface and can easily be removed from the areas of the surface covered with photoresist. The metal layer is then deposited with any method. The photoresist is cleaned off by any standard resist cleaning technique. Once this has been accomplished, the heat spreader or heat reducing substrate is ready for flip chip bonding. Two contact pads are then created—a first contact pad 202 for connection to the VCSEL devices 103, and a second contact pad 204 for connection to the short circuited mesa devices 105.

Figure 3B:
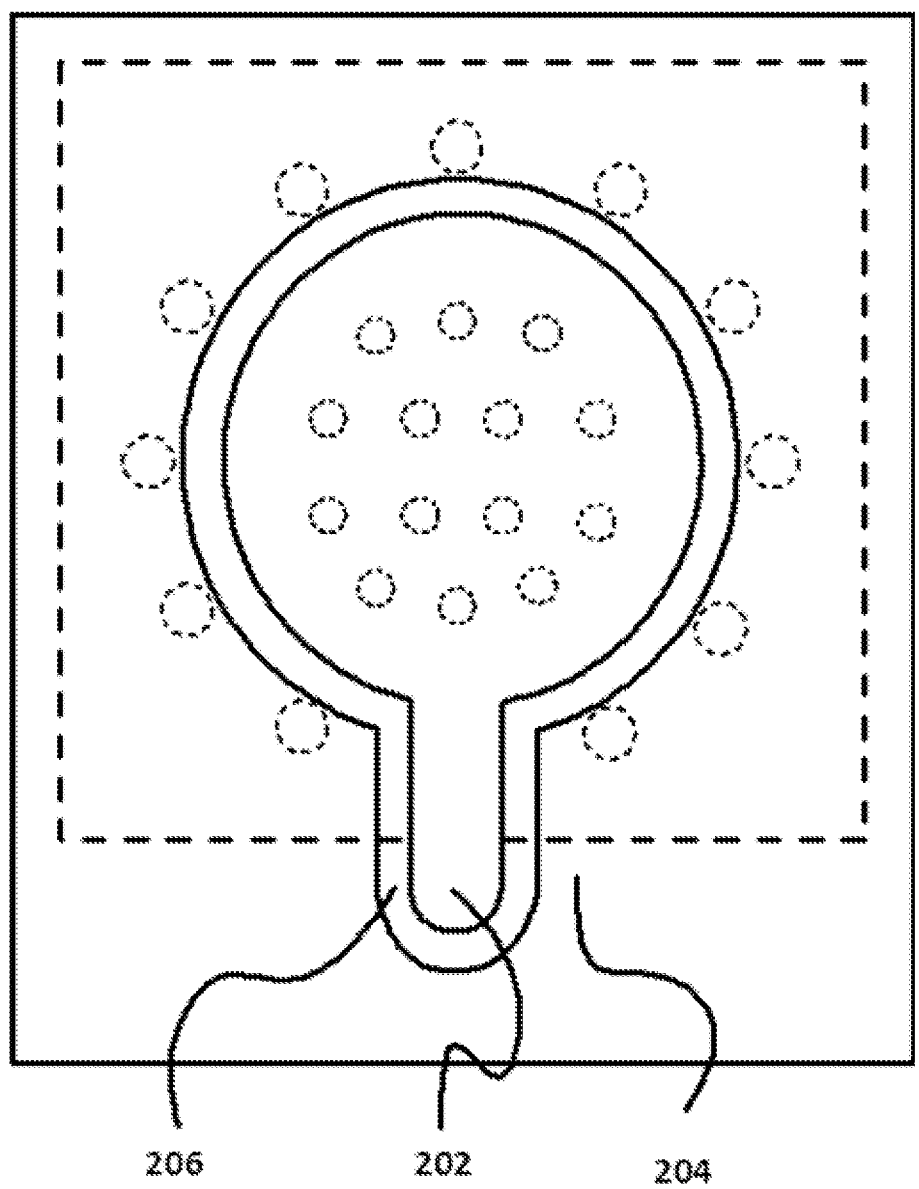
FIG. 3B is an embodiment of the coplanar waveguide for FIG. 3A with the grounding plane extending to the edges of the heat sink and forming a loop around the contact pad of VCSEL devices.

In another embodiment the metal can be deposited upon the entire surface of the dielectric material and then defined with a photolithographic process while exposed areas are etched away leaving two non-connected metal pads 202 and 204. In the embodiment, first contact pad (or signal pad) 202 is approximately circular and second contact pad (or grounding pad) 204 forms a loop around first contact pad 202, so as to form a coplanar waveguide lead in a ground-signal-ground configuration. This configuration is well known for superior signal characteristics and allows flexible device testing and packaging. In other embodiments the contact pad 202 can be square or another shape with the grounding pad 204 forming a loop around it, such as is shown in FIG. 3B. The grounding plane or loop must have a consistent gap 206 width from the contact pad 202 to maintain the best operating characteristics, however, the rest of the ground metal can extend beyond the ring shown in FIG. 3A, and even to the edges of the substrate, as shown in FIG. 3B, for ease of grounding connections.

The coplanar waveguide can be designed to match impedances of the driver circuit by simply adjusting the gap width 206 and/or the signal lead width based on given metal and non-conducting substrate thicknesses and material characteristics. The formulas for calculating the impedance of coplanar waveguides having a dielectric substrate of finite thickness are well known, but lengthy and are not repeated here. By example, however, for a substrate of diamond with a 5.5 dielectric constant, a thickness of the metal layer of 20 µm, a width of the signal lead of 1 mm, and desired impedance of the driver of 50 ohms, the calculated width of the gap (between the signal pad and the ground) should be 200 µm, or 0.2 mm. More accurate calculations requiring many higher order considerations, such as current limits, hysteresis, temperature, surface characteristics and background considerations, could also be performed.

As illustrated in FIGS. 3A and 3B, the VCSEL array and short circuited mesa array are shown as dotted lines to represent where the VCSEL array and the short circuit mesa array will be bonded to the heat spreader substrate, and hence the location of both arrays after bonding. Optionally, In plating or the like for the bonding deposition can also be formed on the heat spreader substrate 200 at these locations. The laser emission is then directed through the mirror 104 and on through the substrate 102 forming a multibeam array. In an embodiment the substrate thickness is reduced in order to reduce optical power losses resulting from substrate transmission characteristics.

Figure 4:
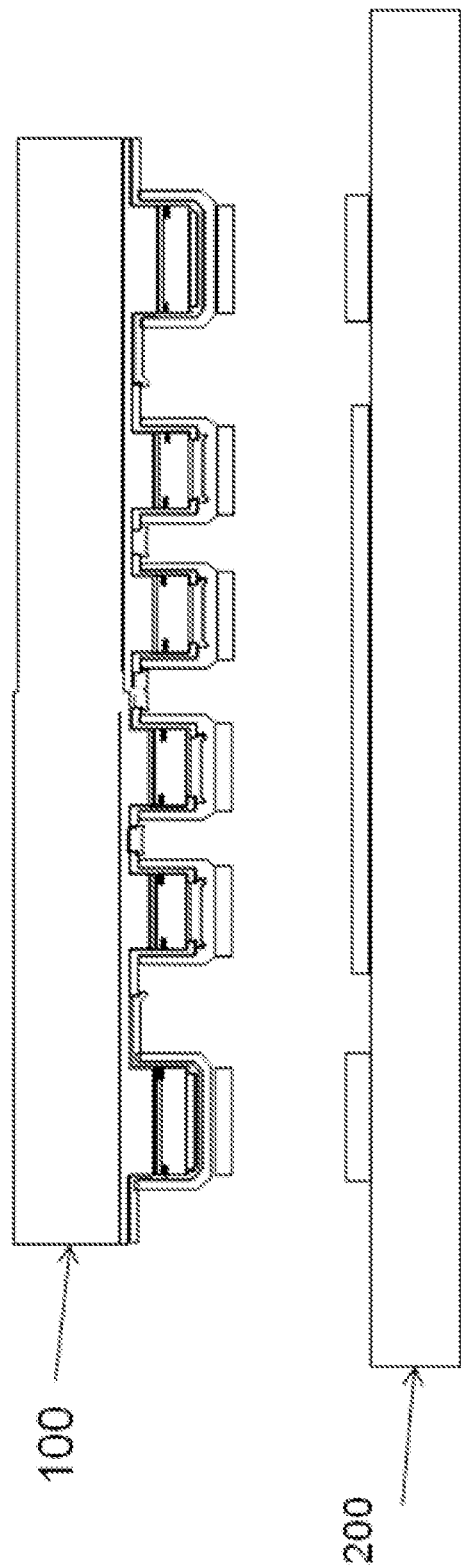
FIG. 4 is a cross-section view of the VCSEL array device of FIG. 2 and the heat spreading substrate of FIG. 3A prior to bonding.

A flip chip bonding is performed on the two substrates with the heat spreader substrate on the bottom. FIG. 4 shows an alignment of VCSEL array 100 with substrate 200, prior to bonding. The bonding process is accomplished by a machine that aligns the two substrates together, then places them in contact with each other and heats one or both substrates either before or after contacting said substrates. In the embodiment described, the bottom substrate was heated to about 285° C. and held at that temperature for about 10 min. A 20 gram weight was used on the downward substrate position. The bonded wafers were allowed to cool to room temperature, finishing their processing.

In another embodiment after flip chip bonding, the substrate 102 can be removed from the mirrors 104 by adding a selectively etched layer such as a layer of Aluminum Gallium Arsenide (AlGaAs) (~98%, Al), with a high Aluminum (Al) content or the like, or a layer composed of Indium Gallium Phosphide (InGaP), or other such selective materials that will etch at greatly different rates than the Galium Arsenide (GaAs) substrate. This layer is grown in the epi growth between substrate 102 and the first epi deposition of mirror 104. Before the etch is added, an under fill of material, such as resist or epoxy, is used to protect the device fabrication features.

An etch consisting of mostly Hydrogen Peroxide ($H_2O_2$) with a small amount of Ammonium Hydroxide ($NH_4OH$) can be used to quickly etch off the substrate leaving the etch selective layer, as the etch will not attack it or the etch rate slows down drastically. After removal of the substrate material the etch layer can be selectively removed without damaging the surface of the material under it by etching the layer in a Hydrochloric acid (Hcl) solution. If substrate removal is done, generally a low resistive contact layer is also grown as a first layer for formation of an n-contact layer as part of mirror 104. After the substrate and selective etch layers have been removed, contacts can be formed on the surface of 104 and circuits can also be formed with common photolithography steps described above.

If the mesas are etched to the substrate, this process could separate each of the VCSEL elements and short circuited mesas from each other, which would benefit the VCSEL array by removing the Coefficient of Thermal Expansion (CTE) associated with the substrate. The CTE is a physical property of materials expressed as the amount of expansion of the material per degrees Celsius. Many times, when multiple materials are used to build devices and the CTEs of those materials do not closely match, stresses can be produced within the device with any temperature changes. With the mesa devices etched to the substrate, the devices will expand at the same rate as the heat sink substrate, except over the much smaller area of where the contacts to the heat sink substrate are formed. In another embodiment the etch process used to remove the substrate could use plasma based chemistry instead of the chemical wet etch technique described above.

The above described process flow is given by way of example only. It will be understood that switching the order of some of the steps described is possible, for example the order of the metal depositions, or depositing one or both of the n-metal or p-metal before the oxidation step. Also, it is possible to replace the top mirror structure 108 with a dielectric DBR stack, or replace the mirror stacks either entirely or partially by etching gratings on the top surfaces of the mesas. The gratings are usually defined by e-beam lithography instead of photolithography and then dry etched to a specific depth. This reflects the light back with a higher efficiency and is possibly less costly than the epitaxially grown mirror or portion of mirror it replaces.

Figure 5:
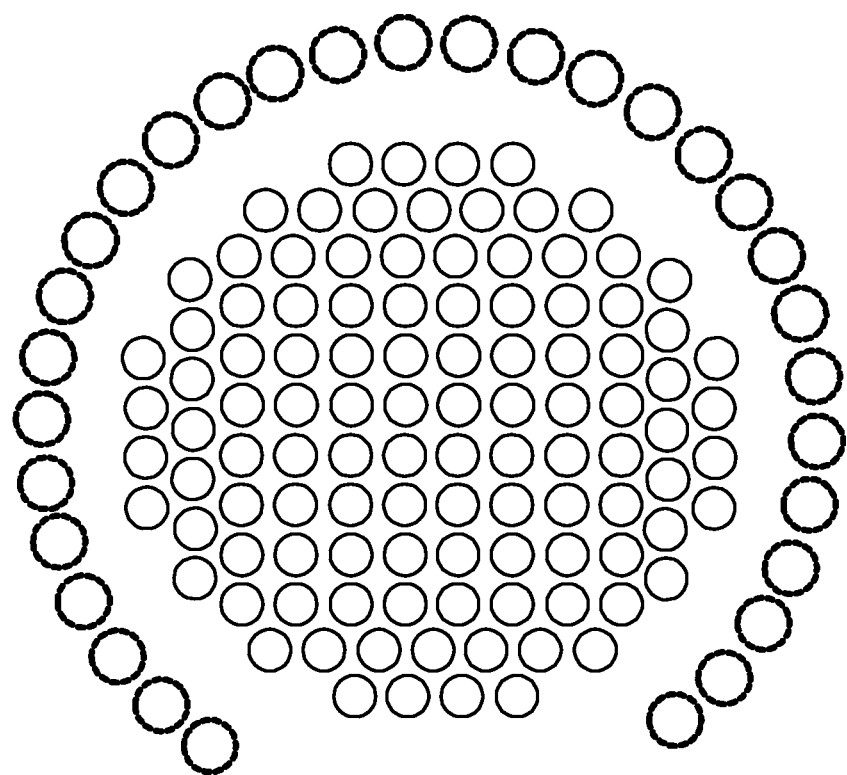
FIG. 5 is an illustration of an embodiment of a VCSEL array device after plating.

The arrays described above have been fabricated and tested. Arrays of high-speed, 980 nm high-power bottom emitting VCSELs have been fabricated. Devices with an active region diameter of 18 µm, in a 24 µm diameter mesa, have been created to form a circularly shaped VCSEL array with 70 µm device pitch. An example of an array formed in a similar manner and shape is illustrated by FIG. 5. Each of the single VCSEL devices (represented by solid circles in FIG. 5) in the VCSEL array are electrically connected in parallel to form a single high-power, high-speed light source. The parallel configuration for both signal and ground paths reduces the series resistance and inductance of the flip-chipped array. In another array that was fabricated and tested, the array used 28 active light producing mesas, evenly spaced apart. They were formed in a circular pattern and the entire area of the active region (contact pad) was less than 0.2 mm². There were 18 shorted mesas (which are similar to those represented by dashed circles in FIG. 5 of the larger array device) in the grounding ring that surrounds the circular pattern of VCSEL devices.

The lasers (and arrays) of the tested devices were fabricated from layers grown using Molecular Beam Epitaxy (MBE) deposited on an n-type GaAs substrate. The light producing portion of the active region 106 in the device of FIG. 1 contains three Indium Gallium Arsenide ($In_{0.18}Ga_{0.82}As$) quantum wells. This VCSEL design employs a gain mode offset, which occurs when the wavelength design of the active region is not the same as the wavelength design of the mirrors at room temperature. When the device heats up, the emission wavelength from the active area will shift a specific amount per degree Celsius. A gain mode offset takes this shift into account, so when the mirrors are designed they match the emission wavelength at an elevated temperature. A gain-mode offset design is well suited for high temperature operation of the array at high bias currents. However, smaller offsets would enhance the modulation response at low temperatures and a lower reflectivity bottom mirror 104 would increase output power. The fabrication of this device with the processes mentioned above reduced thermal resistance down to 425° C./W for a single mesa identical to those used as elements in this array.

Figure 6:
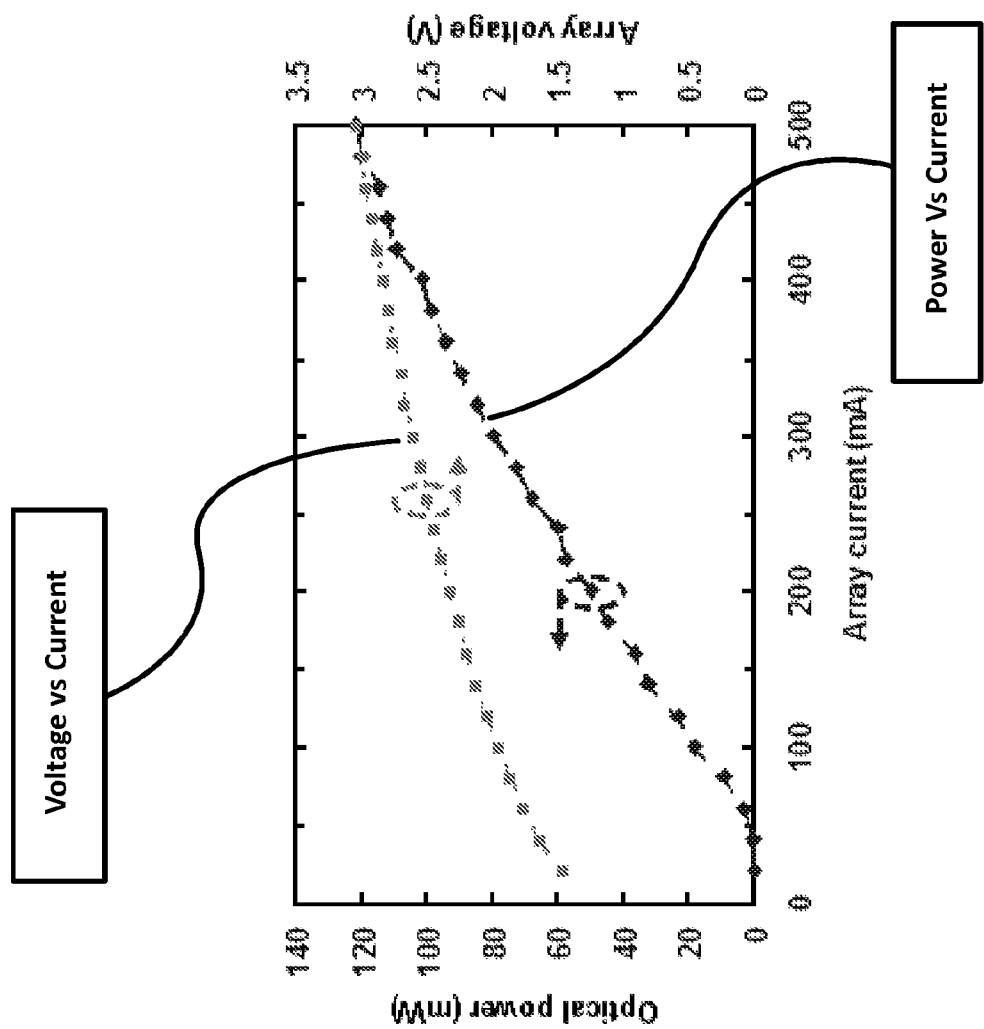
FIG. 6 is a graph showing L-I-V characteristics of an embodiment of a VCSEL array device.

The DC characteristics of the exemplary array were extracted using a Keithley 2400 source meter and a silicon photodiode along with an optical attenuator. FIG. 6 shows the Light-current (I)-Voltage (L-I-V) characteristics of an exemplary array. The threshold current and voltage are 40 mA and 1.7V respectively. The dashed circles over the two lines (representing voltage vs. current and power vs. current) indicate the sides of the chart each of the lines represent so the units can be read properly. The Continuous Wave (CW) output power of the array is above 120 mW at 500 mA bias current and room temperature.

Figure 7:
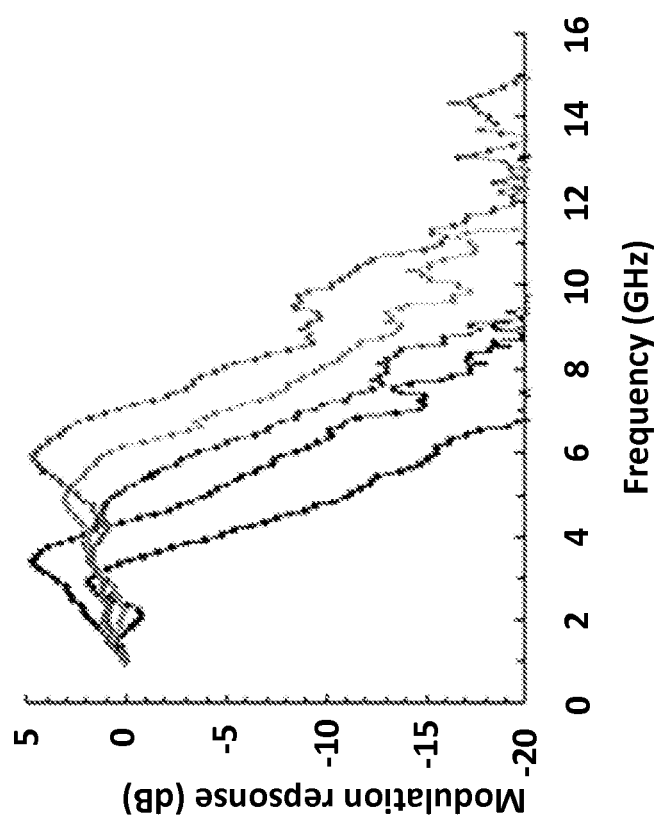
FIG. 7 is a graph showing modulation frequency for an embodiment of a VCSEL array device.

In order to measure the tested array's modulation response, it was biased at fixed currents up to the 500 mA maximum current rating of the Cascade Microtech high frequency probe used in the measurements. The output light was coupled into a multimode bare 62.5 μm core diameter fiber. The output signal of a Discovery Semiconductor DS30S p-i-n photodiode was then amplified by a Miteq radio-frequency low noise amplifier at different bias currents. FIG. 7 shows the modulation responses for selected bias currents at 20° C. The array exhibits a 3 dB frequency of 7.5 GHz at a 500 mA bias current. Cut off frequency of the high current Picosecond Pulse Labs bias tee employed here presents accurate measurements below 1 GHz. The bandwidth can be extended to higher frequencies by increasing the bias current. Frequency response measurements for a single 18 μm active diameter laser nominally identical to those constituting the test array show that a 3 dB modulation frequency of up to and above 10 GHz is achievable.

Figure 8:
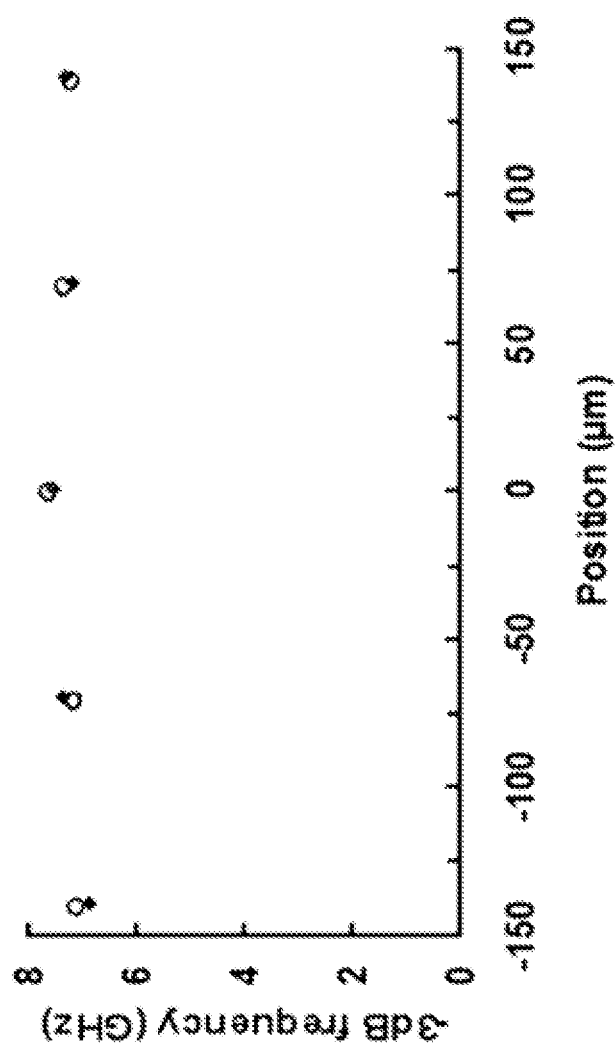
FIG. 8 is a graph showing laser modulation frequency for different array positions at 450 mA bias current for an embodiment of a VCSEL array device.

A bare multimode fiber was employed to scan the whole array area and measure the frequency response of array elements at different positions. FIG. 8 shows that the frequency response of elements of the array at different radii measured from the center of the array is nearly independent of position. Each point indicates the frequency response of an individual device in the array. This result indicates that both the individual laser performance and current distribution are relatively uniform over the entire array. Hence, VCSEL arrays in accordance with the embodiment can be scaled up to hundreds or thousands of elements to achieve watt level CW powers with modulation frequencies approaching 10 GHz. VCSEL arrays of this type are expected to be useful for moderate range, high resolution LIDAR and free-space communication, as well as numerous other applications.

Figure 9:
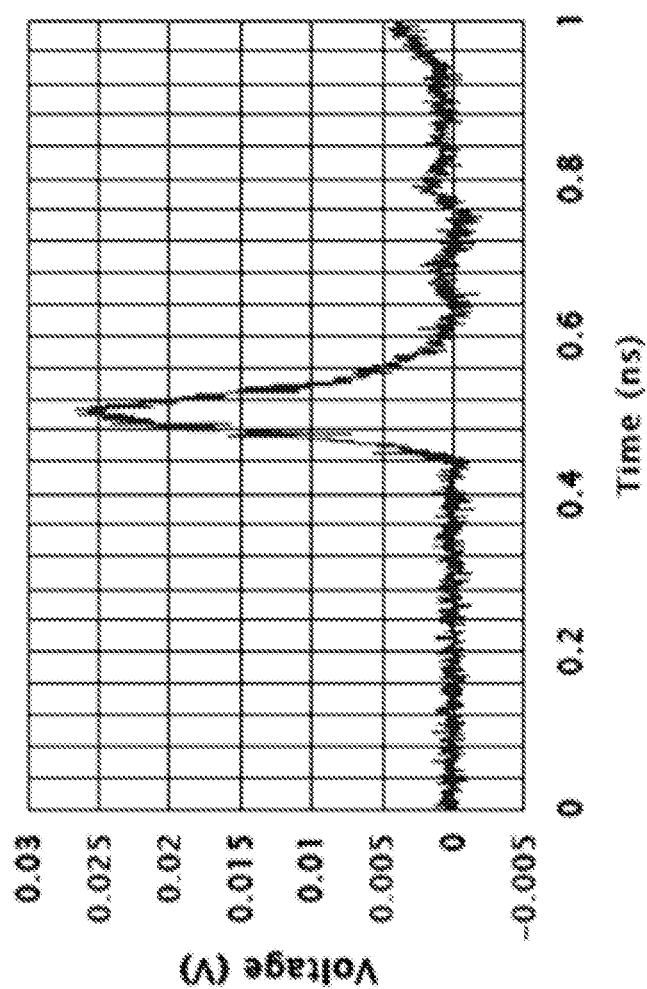
FIG. 9 is a graph showing pulse width from an embodiment of a VCSEL array device.

FIG. 9 shows a pulsed response of an exemplary array with a 50 ps pulse at FWHM (Full Width at Half Max), which indicates the width of the pulse at half of its maximum power. The lines of the chart represent 40 ps divisions.

Effective heat sinking of the device by metal plating and utilization of flip-chip bonding allows CW operation of the tested array at room temperature. As a result, a monolithic multibeam VCSEL array of the type manufactured and tested can have a superior frequency response over other multibeam semiconductor arrays, allowing the benefits of VCSEL beam quality, reliability, modulation flexibility, and cost efficiency to compete with edge emitting semiconductor laser arrays for applications requiring high power.

Figure 10:
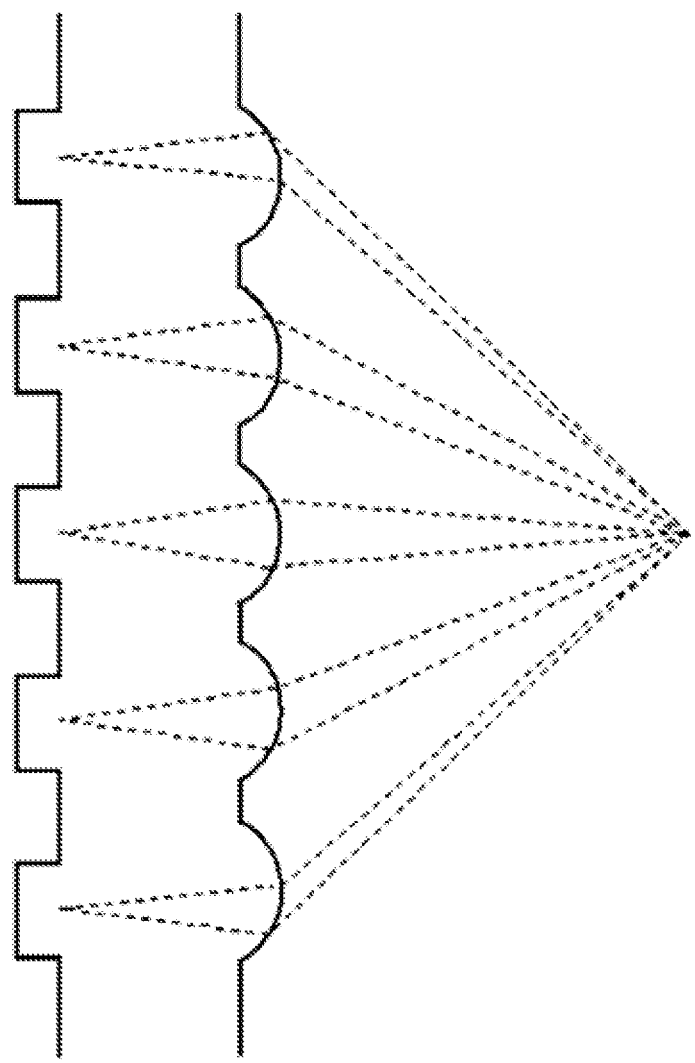
FIG. 10 is a partially-broken, cross-section view of a plurality of lenses positioned on top of a VCSEL array device in accordance with an embodiment.
Figure 11:
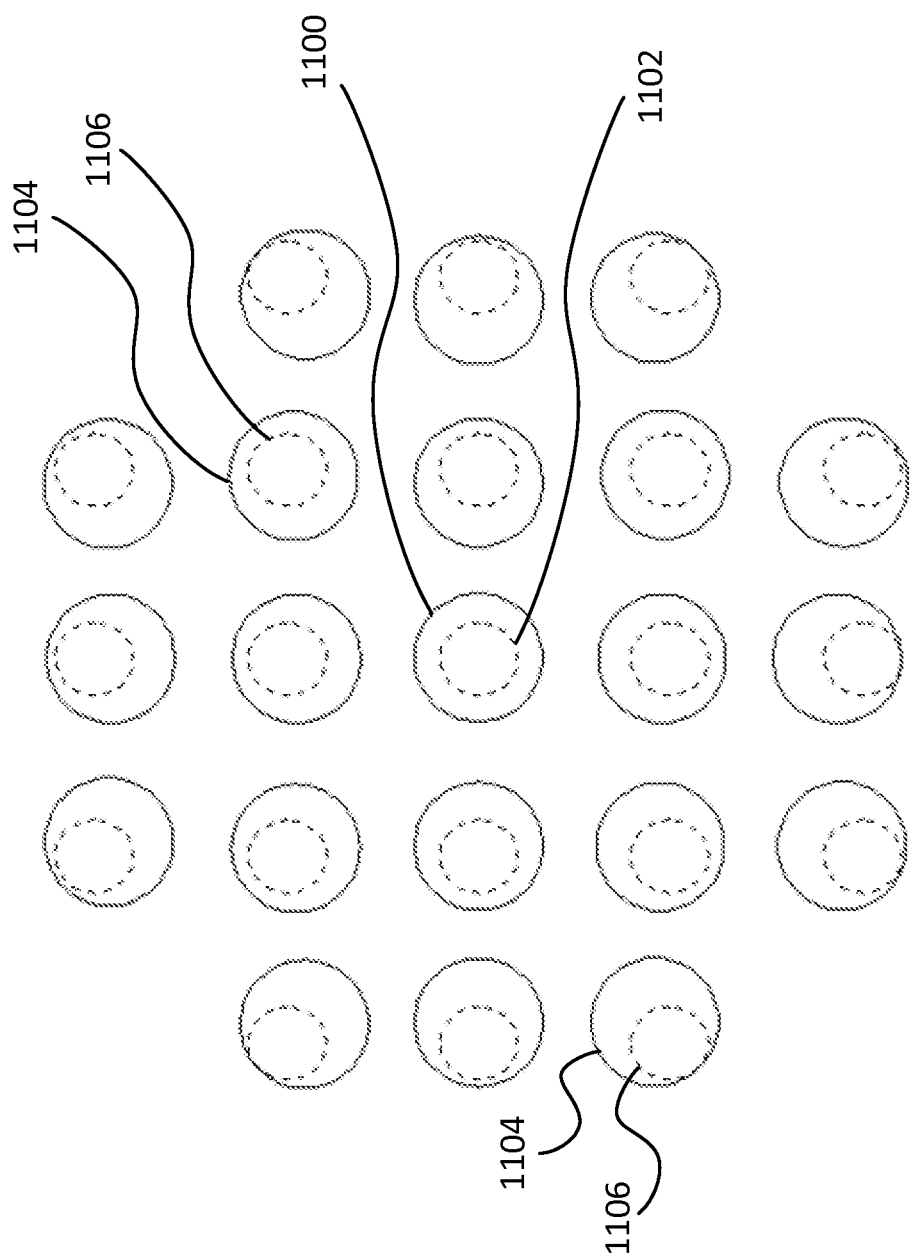
FIG. 11 is an illustration of the manner in which each lens of the plurality of lenses is placed in an offset position over each VCSEL device of the VCSEL array device.

As further illustrated in FIGS. 10 and 11, rather than depend on separate lens structures for collimating or focusing the light emitted by the VCSEL arrays, and be burdened with the physical limitations of such lenses, microlenses may be fabricated on the backside of the surface of substrate 102 by using a number of different processes. One technique for forming such microlenses involves a photolithography process that defines the lens with photoresist, such as in the form of cylinders or other shapes, and then melts the photoresist onto the substrate before transferring those lens shapes to the substrate through an etch. The etch may be a Chlorine (Cl) based dry etch adjusted for or approaching an even etch selectivity between the substrate material and the photoresist, so as to etch both materials at close to or at the same rate. The photolithographic step used to create the lenses is accomplished using a backside wafer alignment system common in the industry. This step would be fabricated either at the end of fabrication of the VCSEL wafer or earlier, but generally before the flip chip process described above.

Other processes that may be used to form the lenses include gray scale lithography, where a partially transmissive photomask may be used to produce relief profiles in the photoresist. For example, the resulting lenses may allow a gradually changing amount of light through different parts of the lens, such as allowing more light to pass around the edges and less light to pass at the center, or vice versa. Various direct write lithography processes may also be used to define a surface profile for a polymer resist coating. Small amounts of polymer materials may also be deposited on the surface of the substrate above each laser device that form lenses as the polymer cures, such as commonly deposited epoxy from inkjets. Instead of fabricating the microlenses directly on the laser array substrate, the microlenses may be fabricated on a separate transparent substrate that is attached and aligned to the laser array. The substrate material used may be any material transparent to the laser wavelength. It may be formed by injection molding, casting, hot pressing or direct machining processes. The same strategy of offsetting microlenses from the optical axis of each emitter may be used with separate microlens arrays.

The profiles of the microlenses fabricated as described herein may be simple, such as the hemispherical lenses illustrated in FIGS. 10 and 11, or more complex, such as aspheric profiles that can be used for extended depth of field applications. In the case of hemispheric lenses, it may also be possible to control an aspheric profile. Other complex optics that may be formed include holographic optics that direct the beam in a variety of directions or diffractive optics that split the beam generated by a laser device into sub-beams, each potentially pointed in a slightly different direction. In addition to the shape of the optics, the optics can have various patterns formed on a surface that may be useful for forming highly astigmatic beam profiles. Likewise, optics may be formed or patterned so as to alter or control polarization.

As illustrated in FIG. 10, which for ease of demonstration is not drawn to scale, the aperture (the diameter) and curvature of each resulting lens will focus the light emitted by each VCSEL device in a desired manner. In order to focus the light from each VCSEL device in a VCSEL array, each lens can be offset by a desired amount to cause what would otherwise be a spread of parallel beams of light emitted by the VCSEL array to be focused into a selected pattern, such as on a tightly focused spot (as previously noted, the distance from the lenses to the beam convergence point of FIG. 10 is not drawn to scale). FIGS. 10 and 11 further illustrate how the lens 1100 (represented by a solid circle) for the centered VCSEL device 1102 (represented by a dashed circle) is centered over that VCSEL device 1102, but the lenses 1104 for the other VCSEL devices 1106 outside of the centered VCSEL device 1102 are positioned at a specified offset distance from the centered VCSEL device 1102 so that light passing through those lenses 1104 is directed to a central point. The manner in which a group of lenses might be offset positioned over an array of VCSEL devices is further illustrated in FIG. 11.

The integrated microlenses described above enable the VCSEL devices to be utilized in short-range free-space optical links that do not require external collimating or collecting optics. This, in turn, enables extremely compact system designs that can be used in thin-profile mobile electronic systems in place of near field RF technologies. With the integrated microlenses described herein, an array of VCSELs can produce a convergent array of beams as described above. For short distances, a few millimeters at most, the convergent beams can efficiently fill a high-speed detector without the need of an external collecting optic. This scheme is ideally suited for free space optical communication between two devices that are brought into contact or near contact (a few millimeters at most) and where an IR-transmissive housing or window is provided. Mechanical alignment can be facilitated by kinematic features on the devices. As further described below, further alignment can be performed by actively selecting subarrays (within the VCSEL array) having associated microlenses that direct light into adjacent areas. For example, when the optical link is established, the most efficiently coupled subarray of emitters may be used while the other subarrays may be dormant. The initial link may use all of the subarrays at first until feedback from the link is established, at which time some of the subarrays may be turned off, which may conserve power and extend battery life of mobile devices.

In the design illustrated in FIG. 10, the detector does not need a collection optic to concentrate the beam down to a small spot as this is provided by the microlenses. The size of the spot and the distance of the beam convergence from the lens surface may be determined by a number of factors, including the lens curvature, degree of offset of the lens from the laser emitter axis, index of refraction of the lens material, and the modal characteristics of the lasers. If the microlenses are aligned axially with the laser emitters (as illustrated in FIG. 11), the beams may be focused, collimated or be more divergent, depending on the radius of curvature of the lens and the distance (defined by the substrate thickness) to the source. If these lenses are laterally offset from the axis, the beam will be directed at an angle to the axis. This is equivalent optically to an object at a given field height being imaged at an off axis position in the image plane. In combination with the focusing effect of the lens, this gives the designer a variety of options in transforming the beam properties of each element of the array. Again, a simple example is the creation of a converging set of beams that overlap at a specific distance from the surface of the lenses. If each lens in the array is offset from the axis with the amount of offset dependent on the distance of the laser array element from the axis, the beams can be made to converge at a single point (as illustrated in FIG. 10) or at a series of axial points in a line. This approach to creating a focused beam spot without a large focusing lens may have other applications besides short range free space optical communication. It may be used for concentrating a beam for materials modification, injecting light into optical fibers and waveguides, optical pumping of solid state and fiber lasers, medical treatments of a specific volume of tissue or location on the skin or other bodily surface or membrane.

Figure 12:
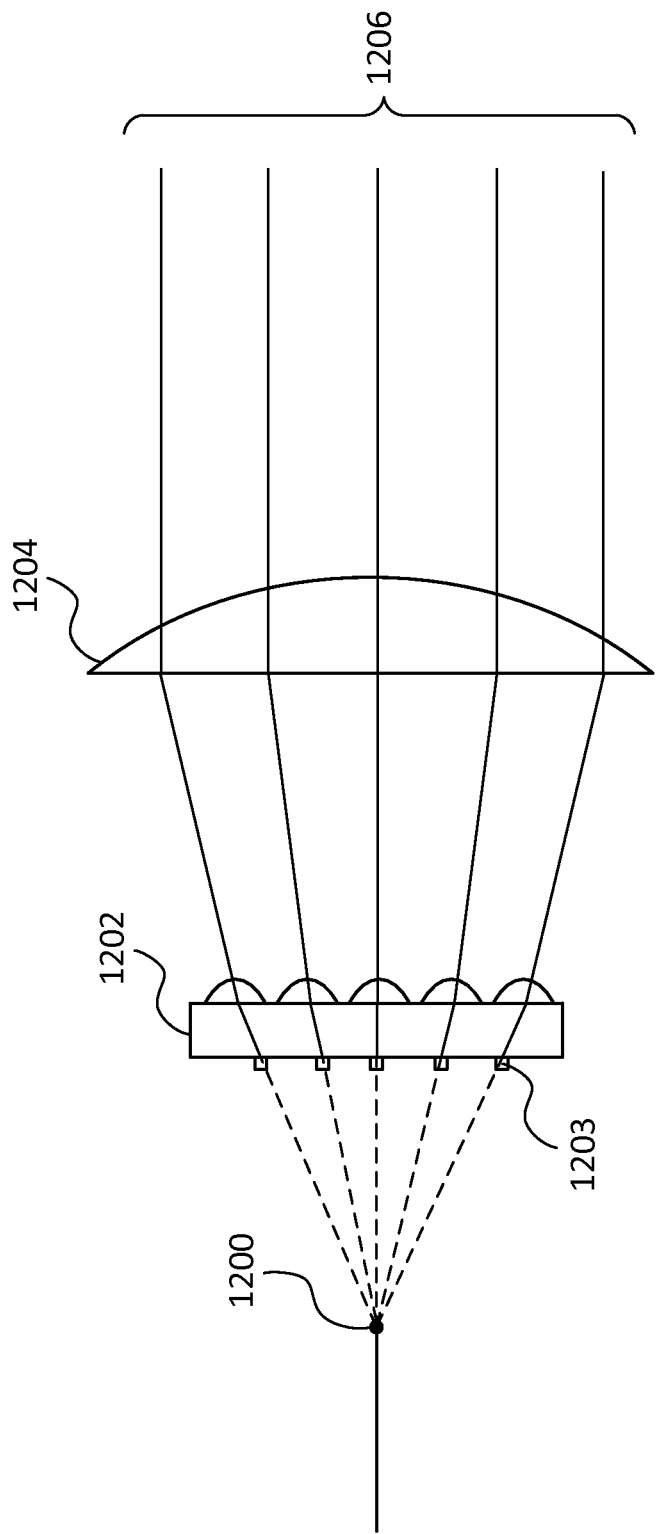
FIG. 12 is an illustration of an embodiment of microlenses having a focal spot located behind the VCSEL array device.

By shifting the lenses off-center with the lasers, as illustrated in FIG. 11, the beam of each laser can be deflected at an angle and focused or defocused, as illustrated in FIG. 10, depending on the microlens design and spacing from the emitter. This allows the designer to converge the beams with a pattern of microlenses with different offsets. This control of the beam direction and focusing allows for the direction of the laser light into a single spot (FIG. 10) where a detector is positioned to receive the signal, but other focusing arrangements are also possible, such as illustrated in FIG. 12, where the focal spot is a virtual focus (which may also act as a virtual source of other optical systems) 1200 located behind the array 1202 of VCSEL devices 1203. In FIG. 12, an additional external lens 1204 is also illustrated to show that it is possible to combine the microlens array with other optical systems to achieve other effects, such as the collimated beams of light 1206 from the array 1202.

Figure 13:
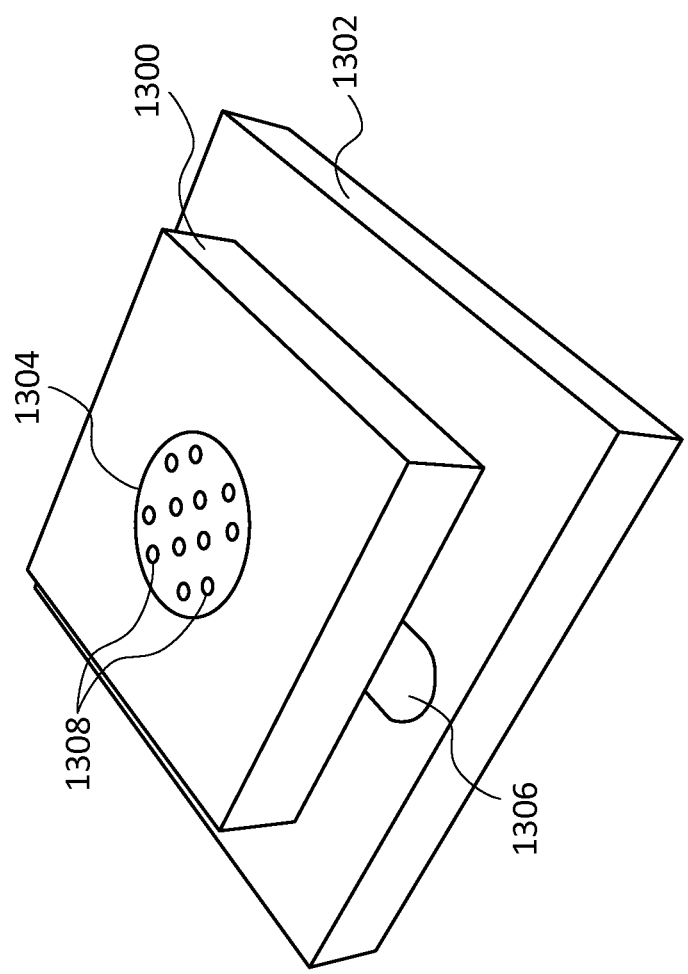
FIG. 13 is an illustration of an embodiment of a VCSEL array device flip-chip bonded to a submount.

In order to uniformly drive an array of VCSELs, embodiments described herein may use a submount to make electrical contact to the laser array (through flip-chip bonding) and the elements of the array may be contacted with a solder ball or other conductive bond to a submount that provides mechanical support, electrical contact and thermal conduction. This is illustrated in FIG. 13, which depicts a laser array 1300 flip-chip bonded to a submount 1302. As illustrated, the lasers (not shown) are located on the bottom surface of the array 1300 and project their light through the thickness of the substrate of the laser array 1300 and through the pad 1304. The lasers of the laser array 1300 are electrically bonded to an electrical contact (not shown) at the end of the impedance matching transmission line 1306, which is positioned under the laser array 1300. The transmission line 1306 provides for transmission of high data rate optical signals to the laser array 1300. The microlenses 1308 are illustrated by the individual circles on the pad 1304 of the substrate of the laser array 1300. The submount 1302 may be formed of many possible materials, including silicon, ceramic, printed circuit boards and flat-flex cables.

The microlens structure described herein, when used in free space optical applications, is referred to as a "lensless" free space optical link because the combined laser array and microlens structure does not require the addition of typical, large collimating and collecting lenses. A lensless link also offers unique alignment techniques that may not be possible with more traditional technology. When laser devices such as those described herein are to be used in free space optical links, the alignment of the transmitting laser beam to the receiving detector is a critical parameter in whether or not the link between the two will be successful. For mobile device applications, this is an especially big problem. A fixed link with no active scanning or alignment adjustment will be difficult to line up, even over very short distances. While the alignment tolerances may be reduced by making the beam spot bigger, this technique is limited by the resulting increased power consumption. In addition, active mechanical scanning or tracking of the transceivers tends to be too bulky and expensive to justify implementation.

Figure 14:
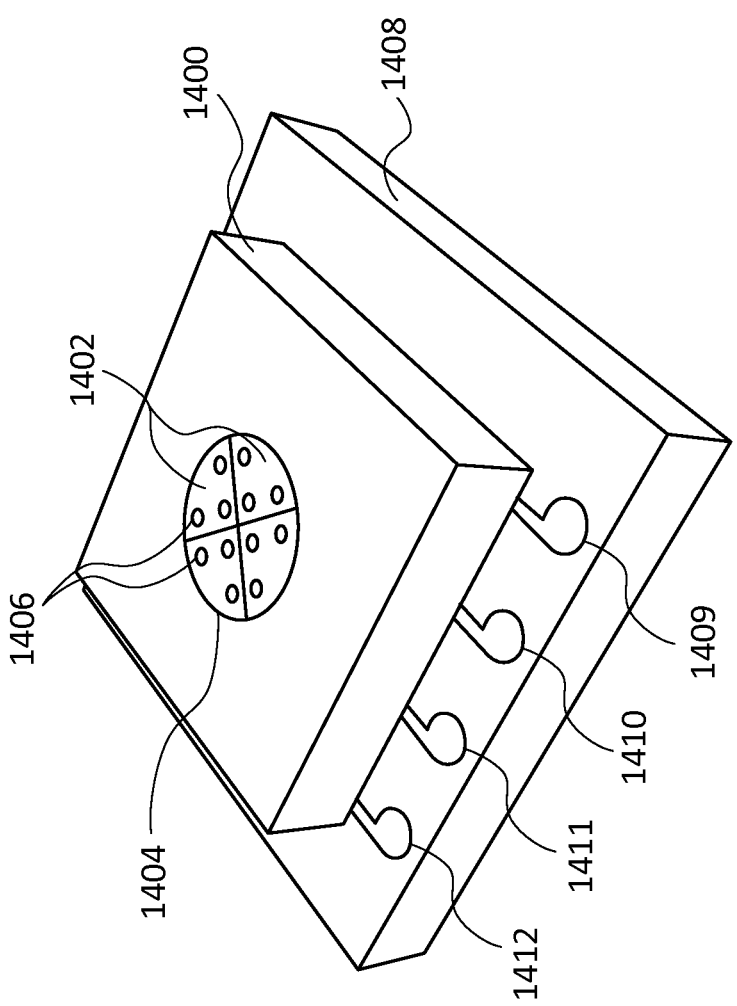
FIG. 14 is an illustration of an embodiment of a VCSEL array device with subarrays flip-chip bonded to a submount.
Figure 15:
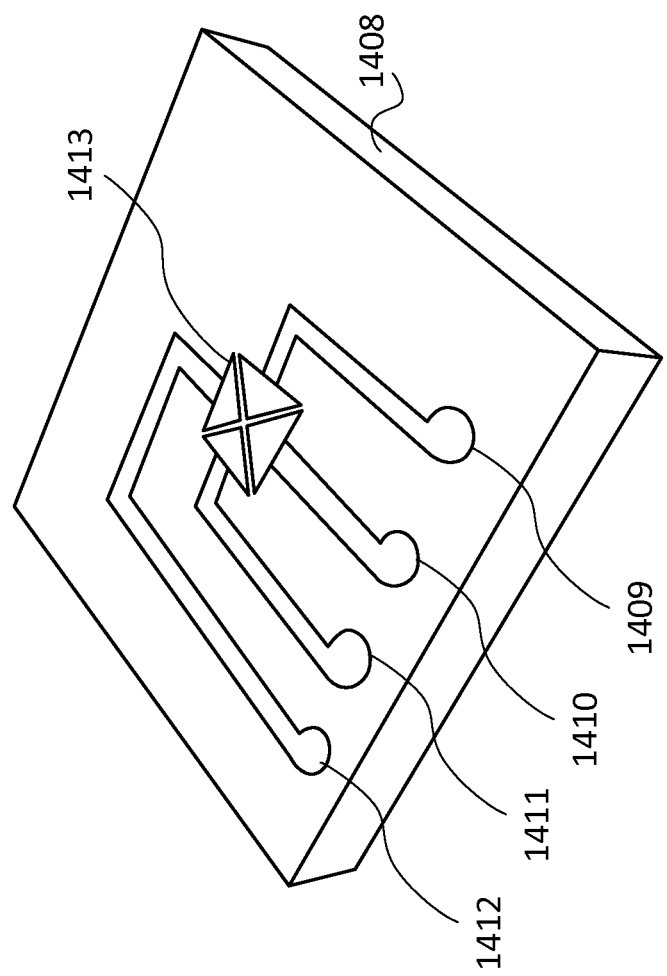
FIG. 15 is an illustration of the electrical contacts and transmission lines of the submount of FIG. 14.

As illustrated in FIG. 14, embodiments described herein may use a multi-element laser array 1400 with the laser emitters (not shown, but located on the bottom of the array 1400 as illustrated) being subdivided into a number of subarrays 1402 shown within the pad 1404 of the substrate. The use of subarrays 1402 adds an active alignment element to any mechanical alignment solutions. In combination with the microlenses 1406, each subarray 1402 may be configured to illuminate a specific region of a volume defined by the combined mechanical tolerances. By applying electrical current to each electrical contact or contact pad 1413 of the transmission line 1409, 1410, 1411 and/or 1412, the corresponding subarray 1402 may be activated and the resulting laser beams directed by the microlenses 1406 lined up with those array elements will define the output of the array. For example, as illustrated in FIGS. 14 and 15, the submount 1408 may include a separate transmission lines 1409, 1410, 1411 and 1412 connected to separate contact pads 1413 for each subarray 1402. Alternatively, the individual lasers could be connected to separate electrical contacts and transmission lines that would enable each of the individual lasers to be driven separately.

As each different subarray that has its own electrical contact, each subarray may be similarly turned on by a control circuit associated with the driver electronics for the array. Subarrays and individual VCSEL devices can also be controlled by a controller other than the driver, such that the driver is under the control of that controller. Using either manner of control, any combination of the subarrays may be turned on individually or in combination within the capability of the addressing and driver electronics. The array 1400 may be configured for a linear scanning or 2D scanning capability and may direct the output to different detectors if that is desired, as further discussed below. This allows for a non-mechanical beam scanning capability. The scanning may be a discrete point to point addressing by the optical beams, or may look more like continuous scanning by a larger number of subarrays with microlenses arranged so that small incremental changes in beam position occur with switching from one subarray to another. While the subarray approach adds array elements, the packing density is high and the increased size of the die is a modest expense for the added system functionality. The size of the array and the number of subarrays may be determined mostly by the tolerances to be covered. The tolerances not only include the alignment of the two system housings to each other, but also the internal variation in the position of the circuit boards within the assembly modules. If the transmitter and receiver are on separate modules within the assembly, there may be tolerances around those assemblies and the fit of those assemblies in whatever kinematic constraints are fabricated into the parts.

Figure 16:
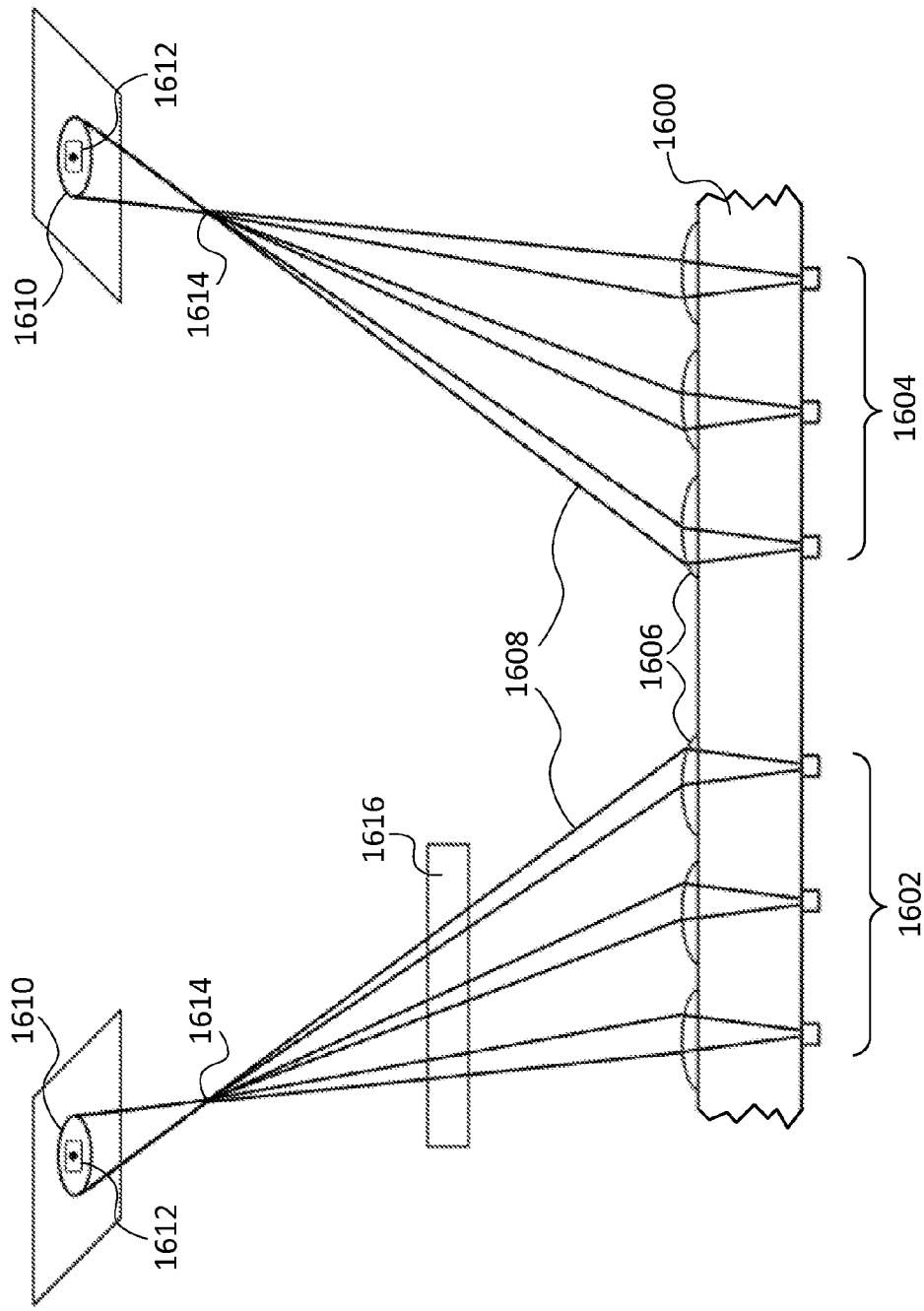
FIG. 16 is an illustration of an embodiment of two subarrays of VCSEL array devices forming circles on detectors.

FIG. 16 is a cross-sectional view illustrating an embodiment of a VCSEL array 1600 with two subarrays or subgroups 1602 and 1604. Subgroups 1602 and 1604 includes a number of corresponding microlens 1606 that are offset in a particular manor so as to direct their beams 1608 and converge those beams 1608 to form circles or blur circles 1610 around the detectors 1612. The circles 1610 are referred to as "blur circles" as they are formed behind the focal point 1614 of the offset subgroups 1602 and 1604. The blur circles 1610 are the area of the beams' 1608 expansion and correlate to where the power density of the beams 1608 is sufficient to enable a particular bandwidth. As the beams 1608 expand, the power density in the blur circles 1610 decrease, and will reach a point where higher bandwidths cannot be supported. In an embodiment, an optical element 1616, such as a holographic optical element, may be positioned somewhere in the path of the beams 1608 in order to homogenize the beams 1608, which serves to reduce bright spots and spread the power in the beams 1608 more evenly. In an embodiment, the subgroups 1602 and 1604 may be formed so the beams 1608 are specifically directed at a detector or groups of detectors so as to form the basis of an optical router.

Figure 17:
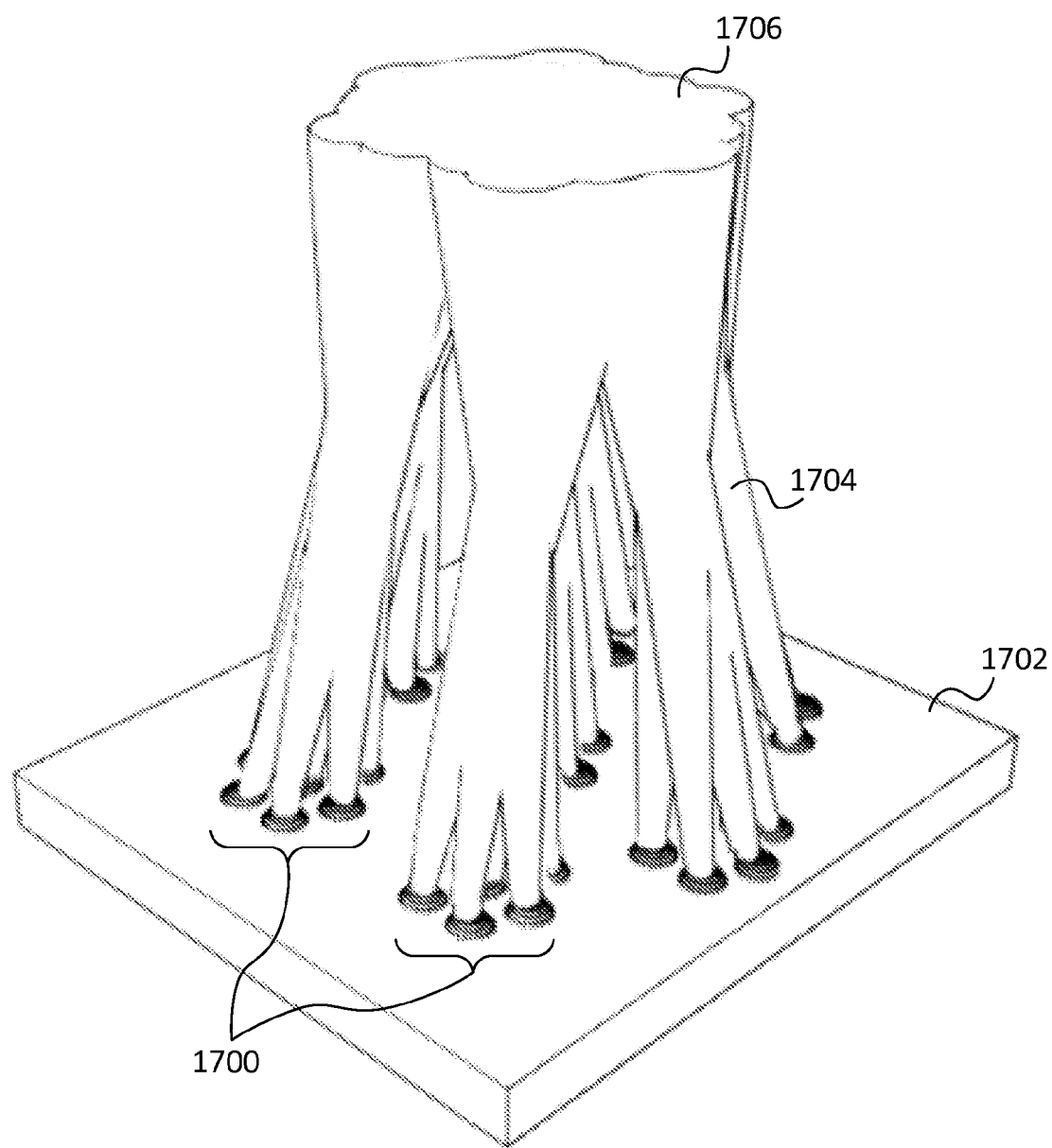
FIG. 17 is an illustration of an embodiment of groupings of subarrays forming a larger circle for a detector.

FIG. 17 is an embodiment of a grouping of multiple subgroups 1700 of an array 1702, with the subgroups 1700 arrayed about a central area, with the exterior subgroups 1700 having a separate converging point for the beams 1704 and where all exterior points are encircling the central subgroup convergence point 1706. This embodiment illustrates a configuration that may form an overlapping of the beams 1704 so that they cover a much larger area 1706 than may be possible with a single VCSEL beam or a single subgroup of VCSEL devices. The configuration illustrated in FIG. 17 may be used by turning on each subgroup in sequence until a return is gathered from a receiver, which in turn identifies which subgroup is best aligned with the detector. Once the best aligned subgroup is determined, all other subgrouped arrays may be powered down to conserve energy and reduce heat build-up. Many other schemes may be likewise employed to identify the subarray 1700 with the best alignment, such as turning all of the subarrays 1700 on, then turning the subarrays 1700 off one at a time. This embodiment may be useful in lower power applications and to increase angular alignment tolerances.

Referring back to FIGS. 14 and 15, the active alignment process for a free space optical link, on initiating the link, may include initially powering up the subarrays 1402 in sequence and determining which subarray 1402 is best able to sustain the link. The control for this process may be provided by the host system. If latency from sequential implementation of the link is too long, the arrays may be powered up together initially and then sequentially powered down while the link is running to optimize the link efficiency.

If there are likely to be shifts in alignment while the link is connected, the control system may then periodically re-optimize the link. Given that a subarray 1402 has to be run at a multiple of the threshold current, it may not be optimum to split power between the subarrays, so the sub-volumes of the tolerance box may need to be carefully partitioned between the subarrays 1402.

The same strategy may be used to optimize the power for the transmitter part of the link separately from the alignment strategy. A subarray used to address a given zone within the tolerance box may have separately contacted elements within it that can be powered on or off to adjust the transmit power. This may have advantages for the control electronics as the selection of the subarrays is a digital switching function as opposed to analog control of the drive current to the lasers. This has some advantages in simplifying the driver electronics. It also allows the arrays to be driven at optimum current levels to maintain high data rates and modulation efficiencies. VCSELs are difficult to modulate at high speed if the current is too close to threshold.

Figure 18:
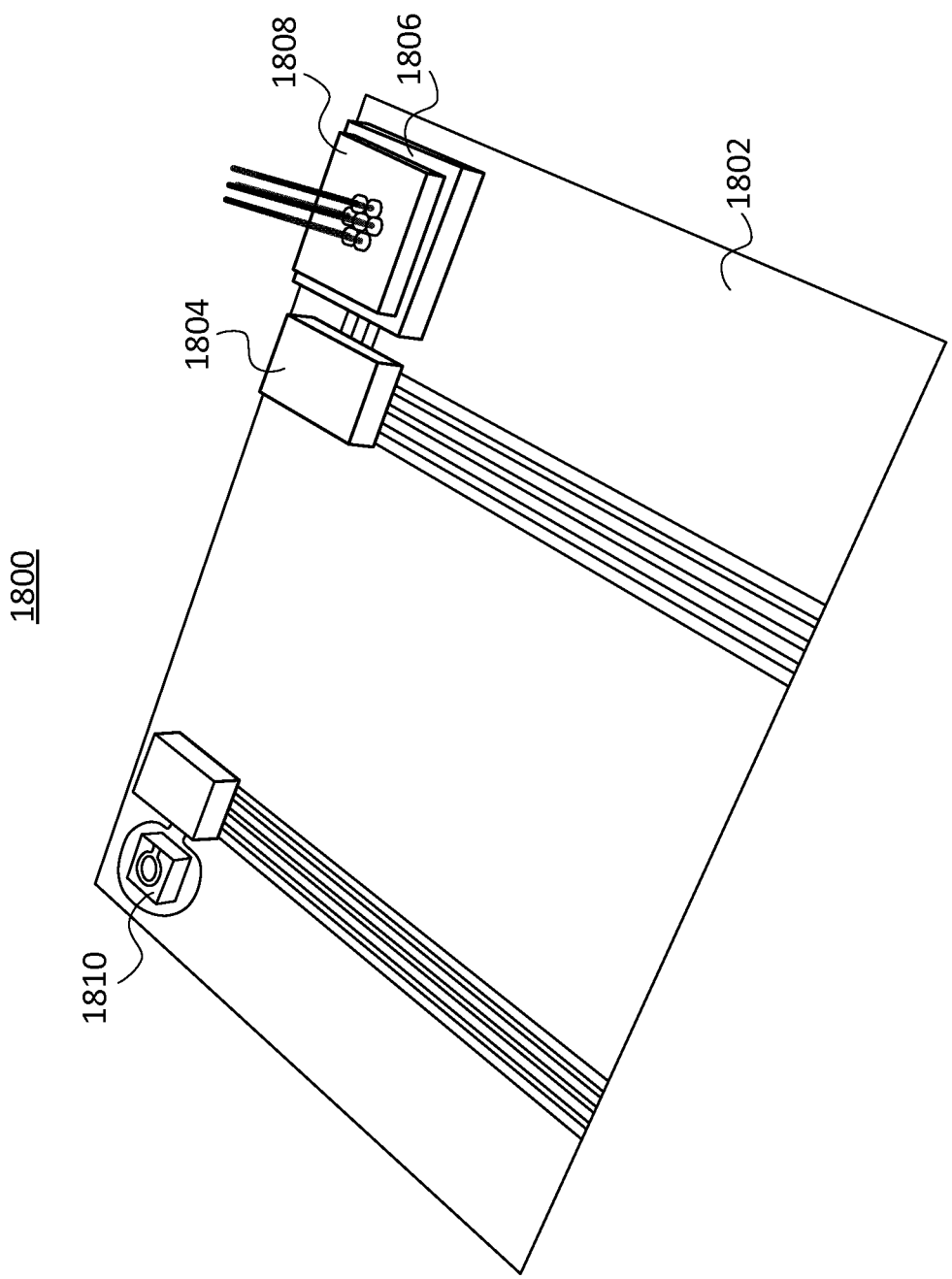
FIG. 18 is an illustration of an embodiment of a transceiver on a submount.

When used in free space optical communication applications, the driver for the laser array, such as driver 1804 of FIG. 18, may include eye-safety circuitry such as that described in co-pending application Ser. No. 13/868,034, the contents of which is incorporated herein by reference in its entirety, and of which the present application is a continuation-in-part. As described therein, in embodiments, an addressable laser array having multiple optical sources (such as individual laser devices or subarrays of such devices) may be used in combination with an electrical circuit so that different combinations of the optical sources can be energized without exceeding eye-safety limits and without requiring monitoring or a feedback loop to control the distance of an observer. Operation of the multiple optical sources may be proximate, which is eye-safe, regardless of the number of or which ones of the optical sources are energized and regardless of the position of observers. As described therein, a laser array with multiple optical sources may also remain eye-safe when there are single-point electrical failures, such as short circuits, in the driving circuit.

Besides short range free space optical communication applications, the scanning capability of the laser arrays described herein can be used to track a receiver that is moving or vibrating in relation to the transmitter with feedback from the receiver than can be sent through the optical link or through a separate channel, which may or may not be optical. It can be used to address individual elements in an array of detectors or an array of optical fibers that act as receivers for detectors or other functions coupled to the other end of the fibers.

A transceiver implementation may be assembled as a hybrid circuit with the transmitter and receiver elements bonded to a substrate by standard hybrid packaging techniques. FIG. 18 shows an embodiment of a transceiver 1800 built on a circuit 1802. The components shown can be bonded to the surface by chip-on-board or by traditional hybrid assembly methods. FIG. 18 shows the laser array 1808 on a separate submount 1806. The laser array may also be flip-chip bonded directly to the surface of the printed circuit. The small laser array may be configured to have a slowly converging set of beams directed by offset microlenses to overlap the beams at a spot a few millimeters from the transceiver 1800. This is sufficient distance to link two mobile devices that are touching at an edge or surface. Some of the electronic functions, such as the laser driver 1804, may also be integrated into the silicon submount 1806. FIG. 18 shows a single transceiver, having a transmitter 1808 and receiver 1810. Two transceivers 1800 facing each other, but with their ends opposite on another so that a laser array transmitter 1808 faces a detector 1810, makes for a complete bidirectional link. The transceivers can bridge a short distance between them through IR-transmissive plastic windows that are in contact or in close proximity. Various means may be used to ensure the surfaces are in contact with some misalignment tolerance limited by kinematic features or other constraints.

Figure 19:
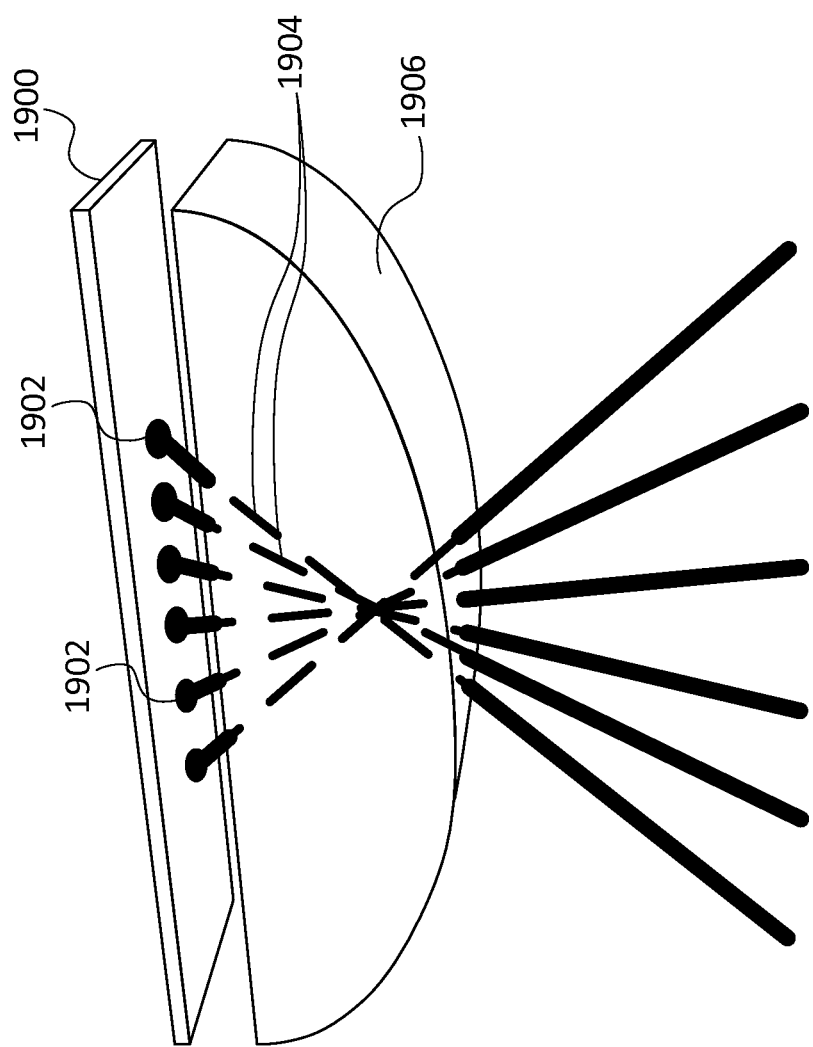
FIG. 19 is an illustration of an embodiment of a linear array of subarrays and an external macro lens.
Figure 20:
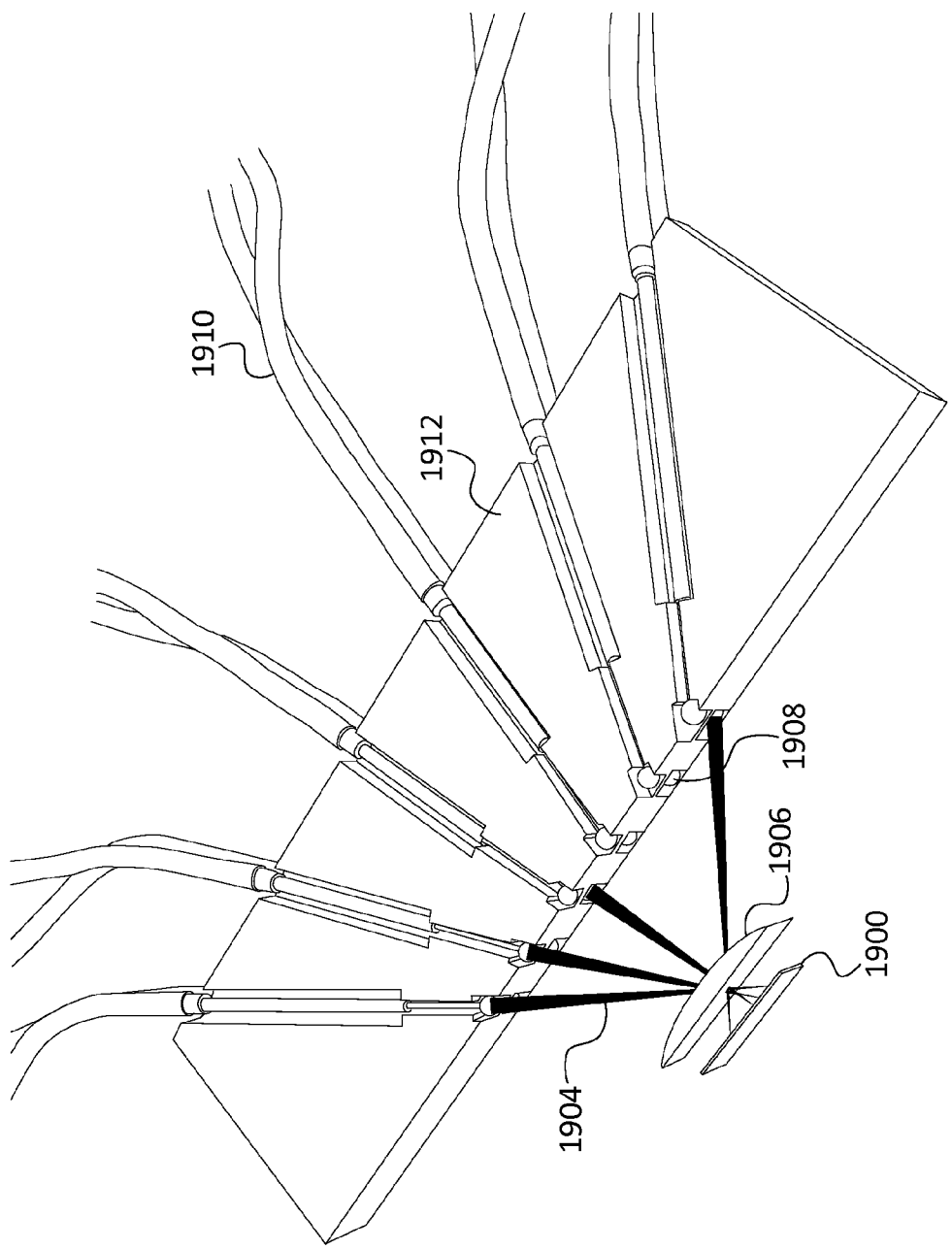
FIG. 20 is an illustration of an embodiment of the linear array of FIG. 17 in a switching application.

As previously noted, one or more laser arrays configured with or without subarrays and with or without microlenses to direct the beams from the arrays/subarrays to detectors may be utilized in a digital switching embodiment. As illustrated in FIG. 19, a linear array of subarray of laser devices 1902 generate beams 1904 from the subarrays that are directed by the external macro lens 1906 (which is shown as a cylinder lens, but could be any of a number of other optical elements, such as a spherical lens). For purposes of illustrating the embodiment, the angle of the beams is shown at angles that may not be realistic givens the physical arrangement of the laser devices 1902 and the optical element 1906. The same array 1900 and macro lens 1906 (which may likewise be a different optical element) are depicted in FIG. 20 to illustrate how the linear array 1900 could be used in a switching application, where selective operation of the laser devices 1902 and the arrangement of the optics/macro lens 1906 serve to direct the beams 1904 to detectors 1908 for fiber optic cables 1910 arranged in a mounting structure 1912.

Figure 21:
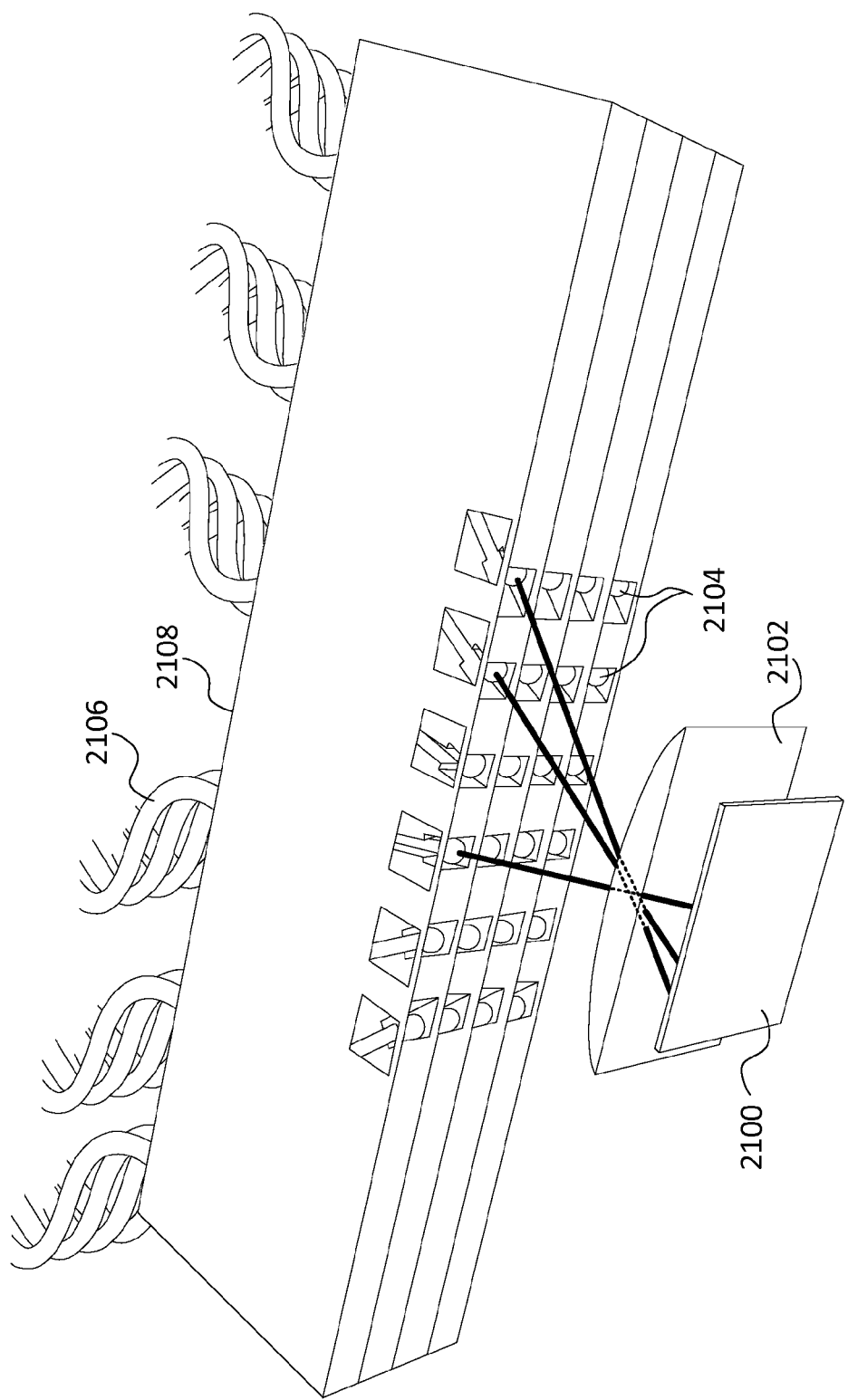
FIG. 21 is an illustration of an embodiment of a non-linear laser array and a macro lens operating as a digital switching device.

FIG. 21 illustrates a further embodiment where a larger non-linear laser array 2100 (which may have a variety of configurations or laser devices or subarrays) and an optics or macro lens 2102 (driven by a driver device and/or controller not shown) are depicted operating as a digital switching device for use with the bank of detectors 2104 for the fiber optic cables 2106 of the structure 2108. While macro lens are illustrated in FIGS. 19-21 directing the beams to locations, other optical elements, such as offset microlens, could be used to achieve the same effect, and combinations of microlenses and optical elements could be used as well.

Figure 22:
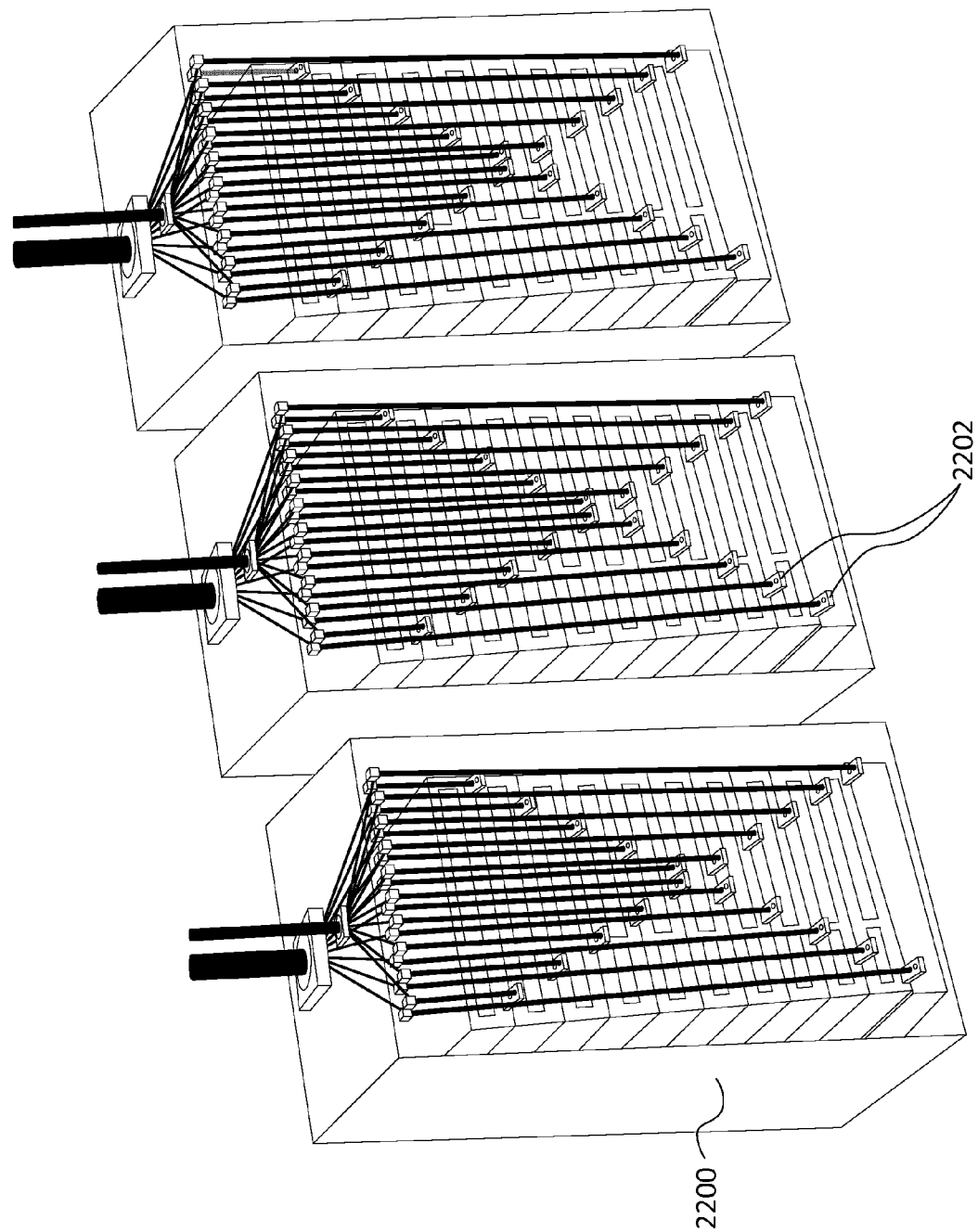
FIG. 22 is an illustration of an embodiment of computing or communication devices connected to digitally switched laser arrays.

FIG. 22 illustrates a further embodiment wherein three or more racks 2200 of computing or communication devices are connected to digitally switched laser arrays 2202 (transceiver type configurations) that transmit and receive data from and to the devices. Within each rack is a plurality of microlens equipped laser arrays on various components directing data carrying beams of light to various detectors that collect the data and further transmit that data away from the racks 2200, which detectors likewise receive data being transmitted to the racks 2200.

Figure 23:
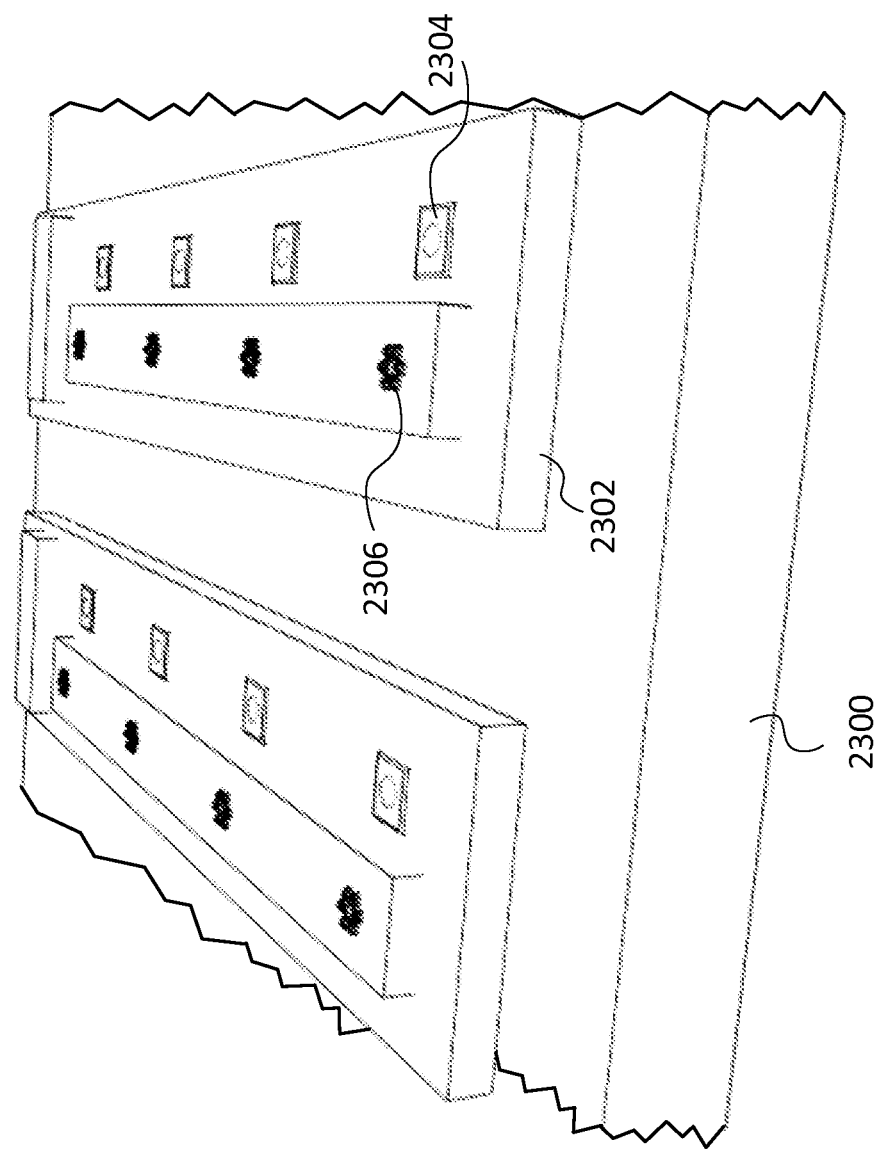
FIG. 23 is an illustration of an embodiment of a linear transceiver.
Figure 24:
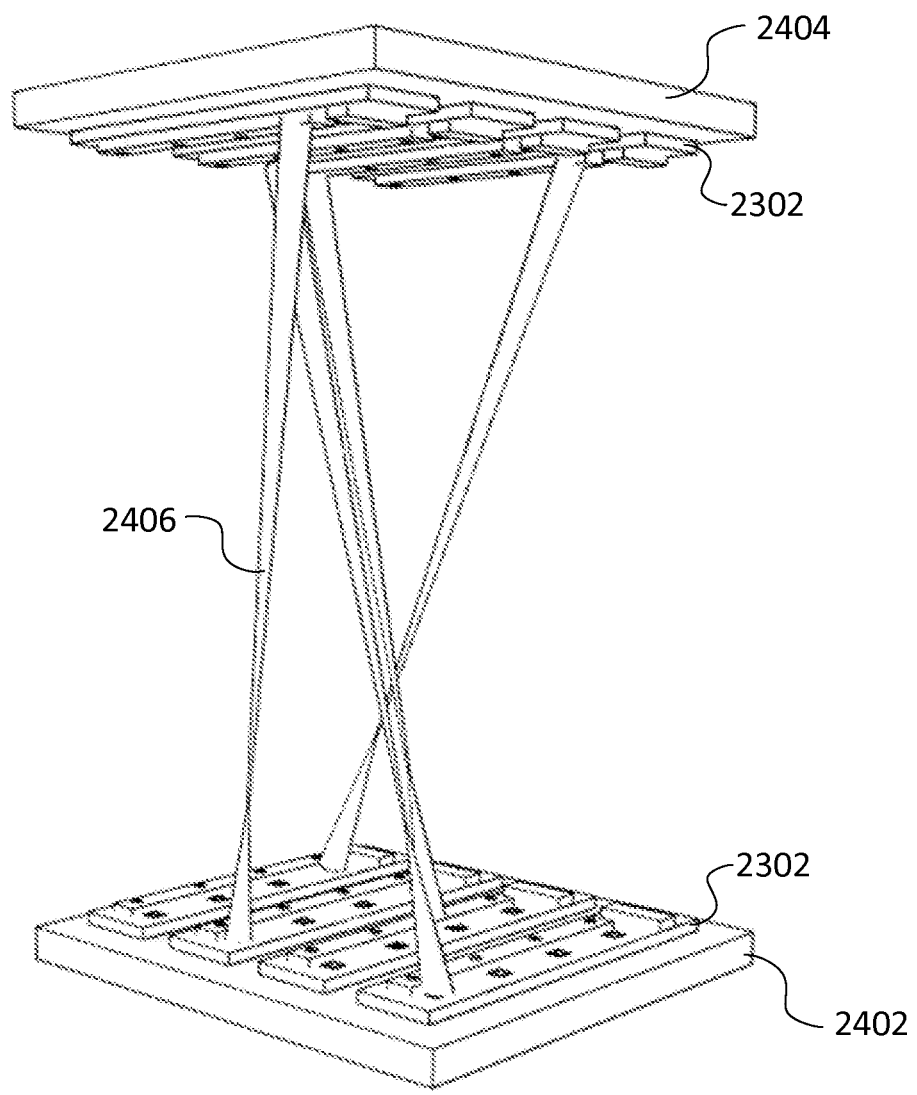
FIG. 24 is an illustration of an embodiment of a 4×4 optical switch.
Figure 25:
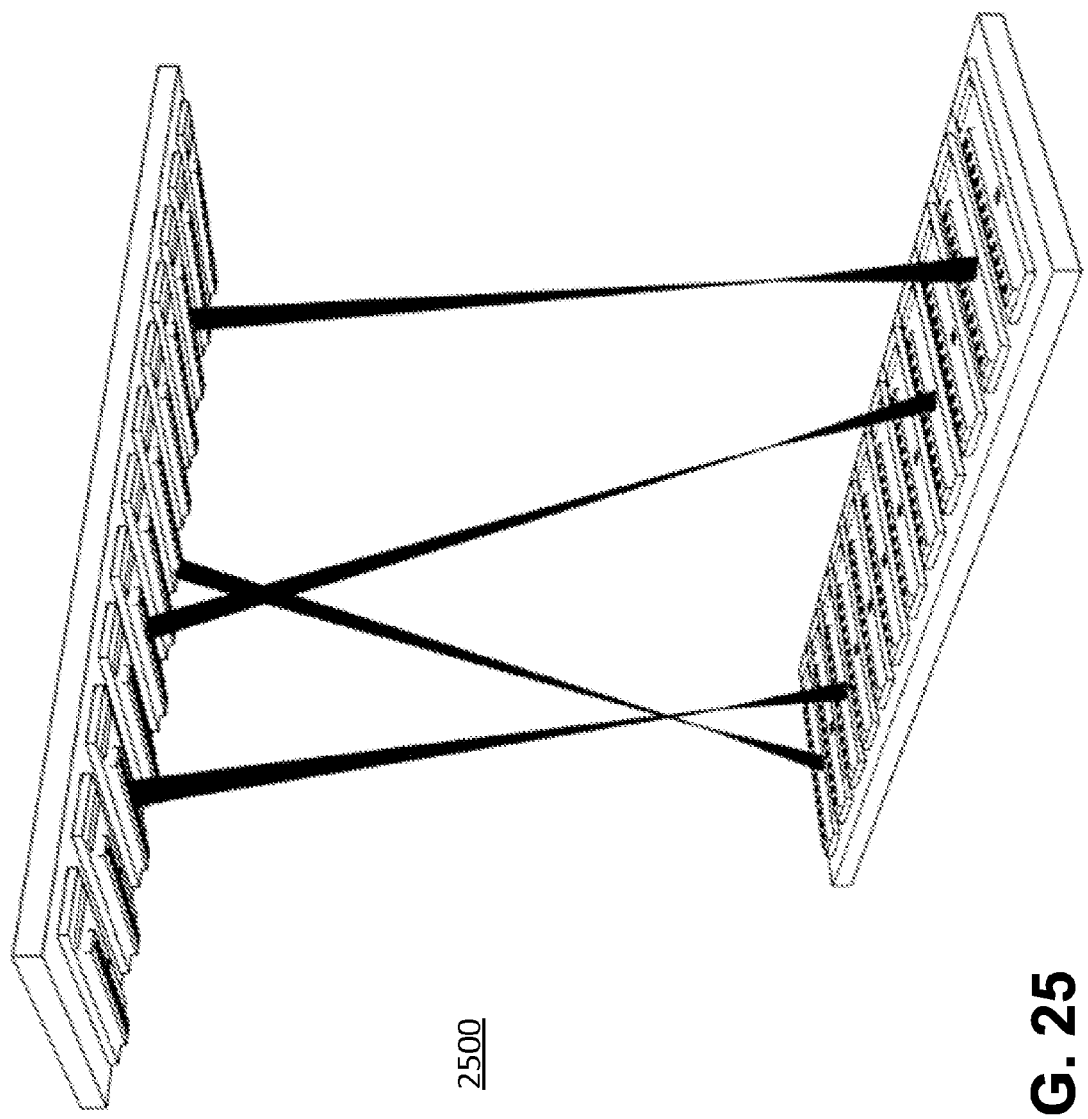
FIG. 25 is an illustration of an embodiment of a 12×12 optical switch.

Additional embodiments of transceivers are illustrated in FIGS. 23-25. In FIG. 23, a configuration is illustrated where each switching element 2302 of a transceiver switch 2300 consists of four detectors 2304 and four transmitters 2306. As illustrated in FIG. 24, a transceiver switch 2402, consisting of four switching elements 2302, may be configured to communicate with an opposing transceiver switch 2404, likewise consisting of four transceiver switching elements 2302. The beams 2406 of each subgroup of transmitters are directed toward a specific detector of the other set of transceivers. FIG. 25 illustrates one of a number of configurations of this optical switch, in this case as a 12×12 optical switch 2500.

It would also be possible to form a simple switch consisting of 12 emitters directed toward 12 groups of transceivers each with its own separate detector and an emitter directed back toward one of 12 detectors on the single router side of the switch allowing all 12 transceivers to communicate back to the routing side of the switch.

Figure 26:
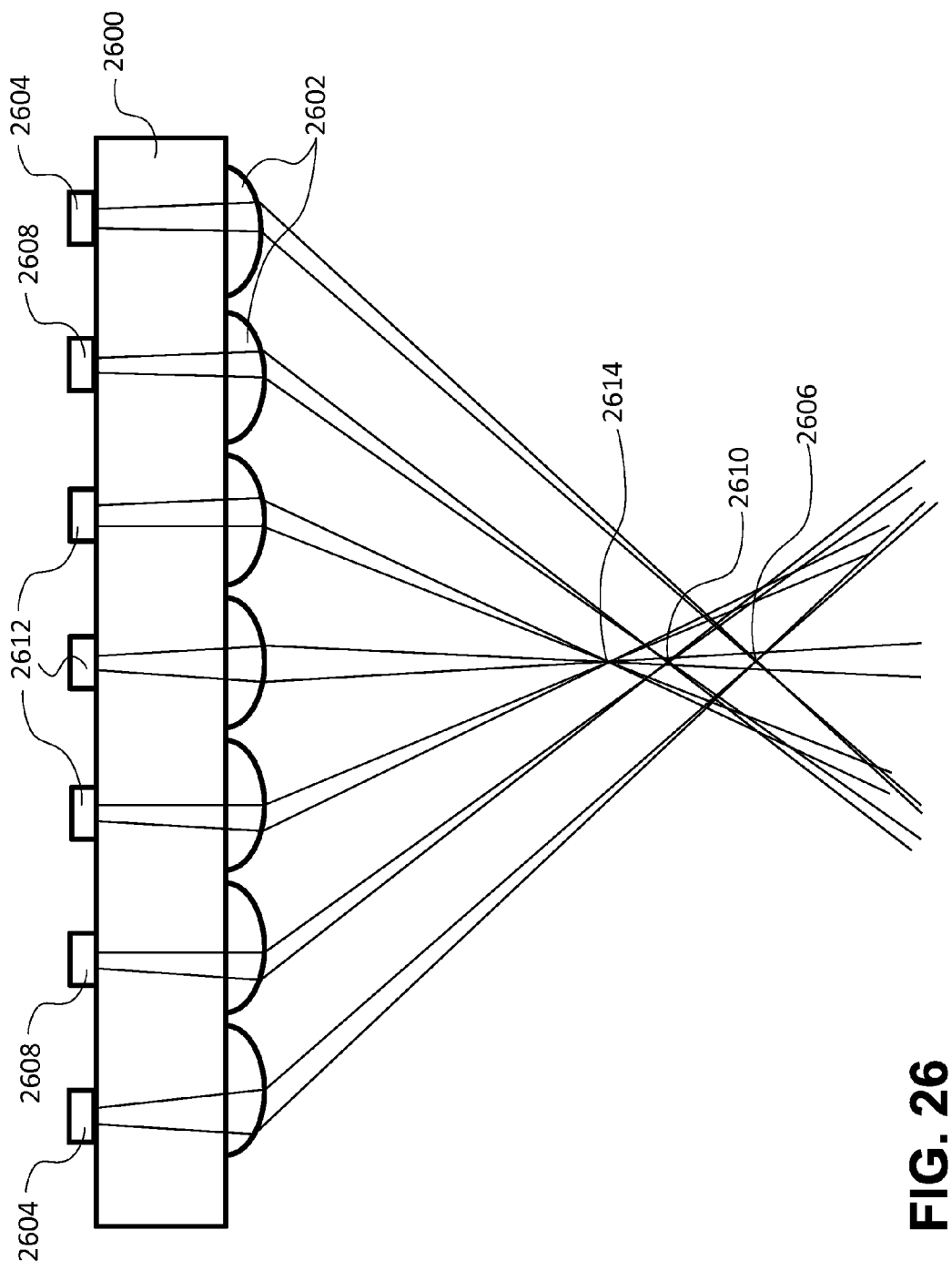
FIG. 26 is an illustration of an embodiment of an array of laser devices focused at different points in space.

There are many other possible configurations of the arrayed subgroups directing beams to detectors, and the reverse, thereby allowing communication between boards, circuits, processors, switches, and the like. There are also other possible configurations of arrayed VCSEL devices and subgroups or subarrays that may be used for other purposes, aside from free space communication. In addition, through utilization of the microlens structures, the individual VCSEL devices or subarrays of a VCSEL array do not all have to be focused on the same focal spot. For example, as illustrated in FIG. 26, a linear array 2600 of VCSEL devices may be focused, through utilization of the microlenses 2602 on more than one focal spot. As shown in FIG. 26, sets of devices may be focused on different common focal spots, such as the two outer devices 2604 being focused on spot 2606, the next two devices 2608 being focused on spot 2610, and the three interior devices 2612 being focused on spot 2614. Focal spots 2606, 2610 and 2614 would effectively form a line in space, which may be useful for use of the laser device as a cutting tool, such as a surgical scalpel. VCSEL devices/subarrays and microlens structures may also be shaped and focused to create other shapes aside from a line, such as a circle of focal spots and other geometric patterns for other purposes. For example, the array 2600 of FIG. 26 could be used for the medical devices noted, but could also be used in the marking of materials by using known techniques, such as a x-y plotter type controller, to mark metal, glass, wood, etc.

While the present invention has been illustrated and described herein in terms of several alternatives, it is to be understood that the techniques described herein can have a multitude of additional uses and applications. Accordingly, the invention should not be limited to just the particular description, embodiments and various drawing figures contained in this specification that merely illustrate a preferred embodiment, alternatives and application of the principles of the invention.

What is claimed:

1. An optical device, comprising:
   a monolithic laser array including a plurality of vertical cavity surface emitting laser (VCSEL) devices and a plurality of raised inactive regions on an electrical contact, the VCSEL devices being arranged in a pattern on a substrate of the laser array, each of the VCSEL devices generating a beam of light having an axis; and
   a plurality of refractive micro lenses formed within the substrate, each microlens among the plurality of microlenses being located over a corresponding VCSEL device, each microlens in a set of microlenses among the plurality of microlenses being positioned over each corresponding VCSEL device at an offset relative to the axis of the VCSEL device so as collimate or concentrate the beam of light emitted by the corresponding VCSEL device to a target or for scanning without requiring optical elements external to the laser array to collimate or concentrate the light for illumination of the target.

2. The optical device of claim 1, wherein the optical device is a transmitter for a free space optical data link.

3. The optical device of claim 1, wherein the offset is a distance from the axis of the corresponding VCSEL device that is necessary to cause the beam of light to converge or diverge on the target or for scanning.

4. The optical device of claim 1, wherein the distance is based on a desired angular deviation of the beam of light.

5. The optical device of claim 1, further comprising a driver circuit for powering the laser array, wherein the pattern includes two or more subarrays of VCSEL devices, wherein each subarray among the two or more subarrays is independently powered and modulated for operation by the driver circuit, and wherein the microlenses for the corresponding VCSEL devices of each subarray are positioned as a group for directing a subarray beam of light from each subarray to the target or for scanning.

6. The optical device of claim 5, wherein the optical device is a transmitter for a free space optical data link including a receiver, wherein each subarray beam of light is directed to a different area of the receiver, and wherein operation of the two or more subarrays by the driver circuit causes each subarray beam of light to actively scan the receiver to identify the subarray or combination of subarrays that provides a best link performance at the receiver.

7. The optical device of claim 6, wherein each subarray and combination of subarrays is sequentially operated by the driver circuit.

8. The optical device of claim 5, wherein each subarray beam of light is directed to a different part of a linear area in space, and wherein operation of the two or more subarrays by the driver circuit causes each subarray beam of light to scan the linear area of space at discrete intervals.

9. The optical device of claim 5, wherein each subarray beam of light is directed to a different part of a two-dimensional pattern in space, and wherein operation of the two or more subarrays by the driver circuit causes each subarray beam of light to scan the two-dimensional pattern in space at discrete intervals.

10. The optical device of claim 5, wherein one or more microlenses among the plurality of microlenses have a different radius of curvature from other microlenses among the plurality of microlenses, wherein each subarray beam of light is directed to a different part of a three-dimensional volume in space, and wherein operation of the two or more subarrays by the driver circuit causes each subarray beam of light to scan the three-dimensional volume in space at discrete intervals.

11. The optical device of claim 5, wherein each subarray beam of light is directed to a common point, and wherein operation of the two or more subarrays by the driver circuit generates a combined subarray beam of light at the common point that varies in strength.

12. The optical device of claim 5, wherein the optical device is a transmitter for a free space optical data link including a receiver, and wherein the strength of the combine subarray beam of light is varied as needed to maintain a quality link with the receiver.

13. The optical device of claim 5, wherein the optical device is a transmitter for a free space optical data link including a receiver, wherein each subarray beam of light is directed in a common direction, but each subarray beam of light is focused at a different distance to maintain a quality link with the receiver.

14. The optical device of claim 5, wherein the optical device is a transmitter for a free space optical data link including a receiver, and wherein operation of the two or more subarrays in different combinations by the driver circuit enables a quality link to be maintained during movement of the transmitter or receiver.

15. The optical device of claim 5, wherein the optical device is a transmitter for a free space optical data link including a receiver, wherein the transmitter is directed as a second receiver, wherein a second transmitter is directed at the receiver, and wherein and the transmitter and the receiver are located at a fixed distance apart and operate as a transceiver.

16. The optical device of claim 15, further including a low bandwidth link between the transmitter and the receiver that provides feedback on a performance of optical links between the transmitter and the second receiver and the second transmitter and the receiver.

17. The optical device of claim 16, wherein the driver circuit for the transmitter operates one or more subarrays separately or in combination based on the performance to improve the performance.

18. The optical device of claim 17, wherein the driver circuit for the transmitter operates one or more subarrays separately or in combination based on the fixed distance, and a geometry between the transmitter and the second receiver and the second transmitter and the receiver.

19. The optical device of claim 15, wherein the transceiver is coupled with additional transceivers to form an optical switch or optical router.

20. The optical device of claim 5, wherein the two or more subarrays are formed on the substrate.

21. The optical device of claim 20, further comprising a submount including two or more electrical contacts, each electrical contact being bonded to a subarray and connecting the subarray to the driver circuit through an impedance matching transmission line built into the submount for providing transmission of high data rate optical signals from the driver circuit to the subarray.

22. The optical device of claim 1, wherein the optical device is a transmitter for a free space optical data link including a receiver, wherein one or more of the plurality of microlenses included kinematic features that are transparent to an infrared wavelength of the beam of light and that align the transmitter with the receiver.

23. The optical device of claim 1, wherein pattern forms a profile.

24. The optical device of claim 23, wherein the profile is hemispherical.

25. The optical device of claim 23, wherein the profile is aspheric.

26. The optical device of claim 23, wherein the profile is holographic.

27. The optical device of claim 23, wherein the profile is astigmatic.

28. The optical device of claim 23, wherein the profile is a polarization control optic.

29. The optical device of claim 1, wherein a focal point for the beam of light emitted by the corresponding VCSEL devices is a virtual focus located behind the laser array.

30. The optical device of claim 29, wherein the virtual focus acts as a source for another optical system.

31. The optical device of claim 1, further comprising:
a current source configured to deliver a total current to the plurality of VCSEL devices; and
an electronic circuit including one or more switches for distributing the total current to zero or more of the VCSEL devices among the plurality of VCSEL devices, the electronic circuit being configured to generate an output power from a single VCSEL device among the optical sources that is eye-safe when the total current is distributed to only the single VCSEL device and to generate a combined optical power from two or more VCSEL devices that is eye-safe when the total current is distributed to two or more VCSEL devices.

32. The optical device of claim 1, wherein the target includes two or more targets, wherein the beams of light emitted by a first group of one or more VCSEL devices are focused on a first target, and at least the beams of light emitted by a second group of one or more VCSEL devices are focused on a second target.

33. The optical device of claim 32, wherein the first target and the second target form a line.

34. The optical device of claim 32, wherein the two or more targets form a geometric pattern.

35. An optical device, comprising:
a monolithic laser array including a plurality of vertical cavity surface emitting laser (VCSEL) devices and a plurality of raised inactive regions on an electrical contact, the VCSEL devices being arranged in a pattern on a first substrate of the laser array, each of the VCSEL devices generating a beam of light having an axis; and
a plurality of refractive microlenses formed within a second substrate bonded to the first substrate, each microlens among the plurality of microlens being located over a corresponding VCSEL device, each microlens in a sect of microlenses among the plurality of microlenses being positioned over each corresponding VCSEL device at an offset relative to the axis of the VCSEL devices so as directing a beam of light emitted by the corresponding VCSEL device to a target or for scanning without requiring optical elements external to the laser array to collimate or concentrate the beam of light emitted by the corresponding VCSEL device to a target or for scanning.

36. The optical device of claim 35, wherein the optical device is a transmitter for a free space optical data link.

37. The optical device of claim 35, wherein the offset is a distance from the axis of the corresponding VCSEL device that is necessary to cause the beam of light to converge or diverge on the target or for scanning.

38. The optical device of claim 35, wherein the distance is based on a desired angular deviation of the beam of light.

39. The optical device of claim 35, further comprising a driver circuit for powering the laser array, wherein the pattern includes two or more subarrays of VCSEL devices, wherein each subarray among the two or more subarrays is independently powered and modulated for operation by the driver circuit, and wherein the microlenses for the corresponding VCSEL devices of each subarray are positioned as a group for directing a subarray beam of light from each subarray to the target or for scanning.

40. The optical device of claim 39, wherein the two or more subarrays are formed on the first substrate.

41. The optical device of claim 40, further comprising a submount including two or more electrical contacts, each electrical contact being bonded to a subarray and connecting the subarray to the driver circuit through an impedance matching transmission line built into the submount for providing transmission of high data rate optical signals from the driver circuit to the subarray.

42. The optical device of claim 39, wherein the optical device is a transmitter for a free space optical data link including a receiver, wherein each subarray beam of light is directed to a different area of the receiver, and wherein operation of the two or more subarrays by the driver circuit causes each subarray beam of light to actively scan the receiver to identify the subarray or combination of subarrays that provides a best link performance at the receiver.

43. The optical device of claim 42, wherein each subarray and combination of subarrays is sequentially operated by the driver circuit.

44. The optical device of claim 39, wherein each subarray beam of light is directed to a different part of a linear area in space, and wherein operation of the two or more subarrays by the driver circuit causes each subarray beam of light to scan the linear area of space at discrete intervals.

45. The optical device of claim 39, wherein each subarray beam of light is directed to a different part of a two-dimensional pattern in space, and wherein operation of the two or more subarrays by the driver circuit causes each subarray beam of light to scan the two-dimensional pattern in space at discrete intervals.

46. The optical device of claim 39, wherein one or more microlenses among the plurality of microlenses have a different radius of curvature from other microlenses among the plurality of microlenses, wherein each subarray beam of light is directed to a different part of a three-dimensional volume in space, and wherein operation of the two or more subarrays by the driver circuit causes each subarray beam of light to scan the three-dimensional volume in space at discrete intervals.

47. The optical device of claim 39, wherein each subarray beam of light is directed to a common point, and wherein operation of the two or more subarrays by the driver circuit generates a combined subarray beam of light at the common point that varies in strength.

48. The optical device of claim 39, wherein the optical device is a transmitter for a free space optical data link including a receiver, and wherein the strength of the combine subarray beam of light is varied as needed to maintain a quality link with the receiver.

49. The optical device of claim 39, wherein the optical device is a transmitter for a free space optical data link including a receiver, wherein each subarray beam of light is directed in a common direction, but each subarray beam of light is focused at a different distance to maintain a quality link with the receiver.

50. The optical device of claim 39, wherein the optical device is a transmitter for a free space optical data link including a receiver, and wherein operation of the two or more subarrays in different combinations by the driver circuit enables a quality link to be maintained during movement of the transmitter or receiver.

51. The optical device of claim 39, wherein the optical device is a transmitter for a free space optical data link including a receiver, wherein the transmitter is directed as a second receiver, wherein a second transmitter is directed at the receiver, and wherein and the transmitter and the receiver are located at a fixed distance apart and operate as a transceiver.

52. The optical device of claim 51, further including a low bandwidth link between the transmitter and the receiver that provides feedback on a performance of optical links between the transmitter and the second receiver and the second transmitter and the receiver.

53. The optical device of claim 52, wherein the driver circuit for the transmitter operates one or more subarrays separately or in combination based on the performance to improve the performance.

54. The optical device of claim 53, wherein the driver circuit for the transmitter operates one or more subarrays separately or in combination based on the fixed distance, and a geometry between the transmitter and the second receiver and the second transmitter and the receiver.

55. The optical device of claim 51, wherein the transceiver is coupled with additional transceivers to form an optical switch or optical router.

56. The optical device of claim 35, wherein the optical device is a transmitter for a free space optical data link including a receiver, wherein one or more of the plurality of microlenses included kinematic features that are transparent to an infrared wavelength of the beam of light and that align the transmitter with the receiver.

57. The optical device of claim 35, wherein pattern creates a profile.

58. The optical device of claim 57, wherein the profile is hemispherical.

59. The optical device of claim 57, wherein the profile is aspheric.

60. The optical device of claim 57, wherein the profile is holographic.

61. The optical device of claim 57, wherein the profile is astigmatic.

62. The optical device of claim 57, wherein the profile is a polarization control optic.

63. The optical device of claim 35, wherein a focal point for the beam of light emitted by the corresponding VCSEL devices is a virtual focus located behind the laser array.

64. The optical device of claim 63, wherein the virtual focus acts as a source for another optical system.

65. The optical device of claim 35, further comprising:
a current source configured to deliver a total current to the plurality of VCSEL devices; and
an electronic circuit including one or more switches for distributing the total current to zero or more of the VCSEL devices among the plurality of VCSEL devices, the electronic circuit being configured to generate an output power from a single VCSEL device among the optical sources that is eye-safe when the total current is distributed to only the single VCSEL device and to generate a combined optical power from two or more VCSEL devices that is eye-safe when the total current is distributed to two or more VCSEL devices.

66. The optical device of claim 35, wherein the target includes two or more targets, wherein the beams of light emitted by a first group of one or more VCSEL devices are focused on a first target, and at least the beams of light emitted by a second group of one or more VCSEL devices are focused on a second target.

67. The optical device of claim 66, wherein the first target and the second target form a line.

68. The optical device of claim 66, wherein the two or more targets form a geometric pattern.

* * * * *